(12) United States Patent
Vitale

(10) Patent No.: US 12,389,102 B2
(45) Date of Patent: Aug. 12, 2025

(54) BUCKET ARCHITECTURE FOR AN IMAGE CAPTURE DEVICE INCLUDING A RECONFIGURABLE PCB MODULE

(71) Applicant: GoPro, Inc., San Mateo, CA (US)

(72) Inventor: Nicholas Vitale, Foster City, CA (US)

(73) Assignee: GoPro, Inc., San Mateo, CA (US)

( * ) Notice: Subject to any disclaimer, the term of this patent is extended or adjusted under 35 U.S.C. 154(b) by 239 days.

(21) Appl. No.: 17/893,673

(22) Filed: Aug. 23, 2022

(65) Prior Publication Data
US 2024/0073506 A1 Feb. 29, 2024

(51) Int. Cl.
H04N 23/51 (2023.01)
H04N 23/55 (2023.01)
H04N 23/57 (2023.01)
H05K 1/18 (2006.01)

(52) U.S. Cl.
CPC ............. *H04N 23/57* (2023.01); *H04N 23/51* (2023.01); *H04N 23/55* (2023.01); *H05K 1/189* (2013.01)

(58) Field of Classification Search
CPC ........ H04N 23/57; H04N 23/51; H04N 23/55; H05K 1/189
See application file for complete search history.

(56) References Cited

U.S. PATENT DOCUMENTS

| | | | |
|---|---|---|---|
| 5,471,027 A | 11/1995 | Call | |
| 6,097,598 A | 8/2000 | Miyahara | |
| 7,329,869 B2 | 2/2008 | Cassel | |
| 9,025,080 B2 | 5/2015 | Samuels | |
| 9,860,970 B2 | 1/2018 | Tolbert | |
| 9,910,342 B2 | 3/2018 | Samuels | |
| 10,613,420 B2 | 4/2020 | Ali | |

(Continued)

FOREIGN PATENT DOCUMENTS

| | | |
|---|---|---|
| CN | 110235059 | 9/2019 |
| CN | 110235059 A | 9/2019 |

(Continued)

OTHER PUBLICATIONS

International Search Report and Written Opinion for App. No. PCT/US2021/019970, dated Jun. 3, 2021, 9 pages.

(Continued)

*Primary Examiner* — Twyler L Haskins
*Assistant Examiner* — Surafel Yilmakassaye
(74) *Attorney, Agent, or Firm* — Young Basile Hanlon & MacFarlane, P.C.

(57) ABSTRACT

An image capture device is disclosed that includes: a front housing portion; a rear housing portion including a heatsink that is connected to the front housing portion; and a printed circuit board (PCB) module that is operatively connected to the front housing portion. The PCB module includes: a front PCB assembly; a rear PCB assembly; and a connector that extends between the front PCB assembly and the rear PCB assembly. The connector includes a flexible construction that facilitates reconfiguration of the PCB module during assembly of the image capture device between a first configuration, in which the front PCB assembly and the rear PCB assembly are oriented in non-parallel relation, and a second configuration, in which the front PCB assembly and the rear PCB assembly are oriented in generally parallel relation.

13 Claims, 15 Drawing Sheets

(56) References Cited

U.S. PATENT DOCUMENTS

| | | |
|---|---|---|
| 10,656,689 B2 | 5/2020 | Kilgore |
| 10,701,249 B1* | 6/2020 | Guo .................. H05K 7/20318 |
| 11,146,711 B1 | 10/2021 | Crow |
| 11,277,545 B2 | 3/2022 | Crow |
| 2003/0128536 A1 | 7/2003 | Radu |
| 2003/0202328 A1 | 10/2003 | Deeney |
| 2004/0169771 A1 | 9/2004 | Washington |
| 2006/0100336 A1 | 5/2006 | Fukui |
| 2008/0056695 A1 | 3/2008 | Huang |
| 2008/0205881 A1 | 8/2008 | Sakurai |
| 2009/0274953 A1 | 11/2009 | Myers |
| 2010/0296805 A1 | 11/2010 | Mayer |
| 2011/0127912 A1 | 6/2011 | Lee |
| 2011/0194009 A1 | 8/2011 | Park |
| 2012/0035418 A1 | 2/2012 | Talbert |
| 2014/0055671 A1 | 2/2014 | Kawamura |
| 2014/0104479 A1 | 4/2014 | Samuels |
| 2014/0160284 A1 | 6/2014 | Achenbach |
| 2015/0049243 A1 | 2/2015 | Samuels |
| 2015/0365569 A1* | 12/2015 | Mai ........................ G03B 17/55 |
| | | 348/373 |
| 2016/0174408 A1 | 6/2016 | Tolbert |
| 2016/0334692 A1 | 11/2016 | Samuels |
| 2016/0349601 A1 | 12/2016 | Kungl |
| 2016/0374190 A1 | 12/2016 | Tolbert |
| 2017/0070652 A1 | 3/2017 | Müller |
| 2017/0156205 A1* | 6/2017 | Liu ..................... H05K 1/0278 |
| 2017/0195531 A1 | 7/2017 | Warren |
| 2017/0195533 A1 | 7/2017 | Seo |
| 2017/0200992 A1 | 7/2017 | Piggott |
| 2017/0294694 A1 | 10/2017 | Tso |
| 2018/0107099 A1 | 4/2018 | Yasuda |
| 2018/0259831 A1 | 9/2018 | Chiu |
| 2019/0041600 A1 | 2/2019 | Sakamoto |
| 2019/0056643 A1 | 2/2019 | Chang |
| 2019/0163037 A1 | 5/2019 | Koyama |
| 2019/0346126 A1 | 11/2019 | Wada |
| 2020/0033774 A1 | 1/2020 | Shinji |
| 2020/0064533 A1 | 2/2020 | Miyazaki |
| 2020/0344395 A1 | 10/2020 | Guo |
| 2020/0413567 A1 | 12/2020 | Chusseau |
| 2021/0033815 A1 | 2/2021 | Lin |
| 2021/0122299 A1 | 4/2021 | Garcia |
| 2021/0274067 A1 | 9/2021 | Crow |
| 2021/0306536 A1 | 9/2021 | Vitale |
| 2021/0321027 A1 | 10/2021 | Crow |
| 2021/0344819 A1 | 11/2021 | Vitale |
| 2022/0021795 A1 | 1/2022 | Crow |
| 2022/0124226 A1* | 4/2022 | Jeong ..................... H05K 1/144 |
| 2022/0159148 A1 | 5/2022 | Crow |
| 2023/0009451 A1* | 1/2023 | Connolly ............... H04N 23/57 |
| 2024/0073499 A1 | 2/2024 | Vitale |
| 2024/0073500 A1 | 2/2024 | Vitale |

FOREIGN PATENT DOCUMENTS

| | | |
|---|---|---|
| JP | 2004020798 | 1/2004 |
| JP | 2004020798 A | 1/2004 |
| JP | 2006086752 A | 3/2006 |
| JP | 2008015476 A | 1/2008 |
| JP | 5322866 B2 | 10/2013 |
| JP | 2017073634 | 4/2017 |
| JP | 2017073634 A | 4/2017 |

OTHER PUBLICATIONS

International Search Report and Written Opinion for App. No. PCT/US2021/026140, dated Jul. 1, 2021, 10 pages.

U.S. Appl. No. 16/803,139, filed Feb. 27, 2020, Crow et al.

* cited by examiner

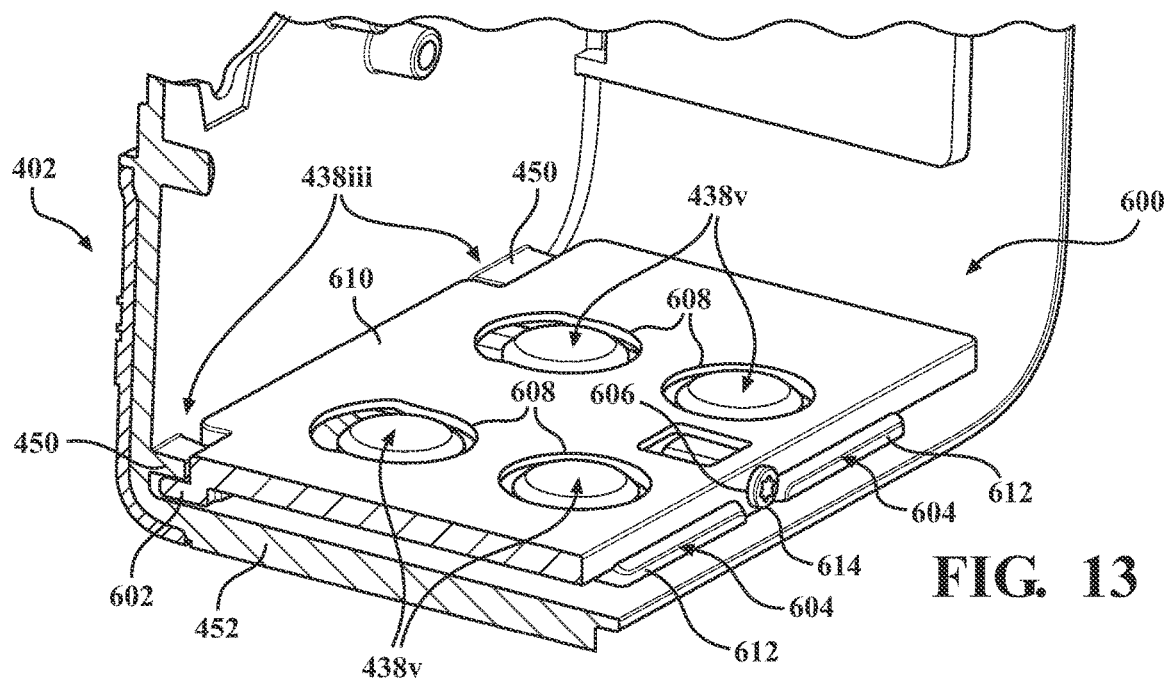

BUCKET ARCHITECTURE FOR AN IMAGE CAPTURE DEVICE INCLUDING A RECONFIGURABLE PCB MODULE

TECHNICAL FIELD

The present disclosure relates to an image capture device and, more specifically, to a bucket architecture for a front housing portion of the image capture device that facilitates the insertion of various internal components in a single (e.g., forward, front) direction and connection of the various internal components to the front housing portion.

BACKGROUND

Image capture devices are used in a variety of applications, including, for example, handheld cameras and video recorders, cell phones, drones, etc. Image capture devices typically include one or more optical elements (e.g., lenses) that capture content by receiving and focusing light as well as one or more image sensors that convert the captured content into an electronic image signal that is processed by an image signal processor to form an image. In some image capture devices, the optical element(s) and the image sensor(s) are combined into a single unit, which is known as an integrated sensor-lens assembly (ISLA). In addition to the ISLA, image capture devices include an array of internal components, both structural and electrical, that require precise placement and alignment, which results in a cumbersome and complex assembly process. As such, an opportunity exists to improve not only the assembly of image capture devices, but product packaging.

The present disclosure addresses this opportunity by providing a bucket architecture for a front housing portion of an image capture device that simplifies assembly and contributes to a reduction in the overall form factor.

SUMMARY

In one aspect of the present disclosure, an image capture device is disclosed that includes: a front housing portion that defines an internal compartment; a rear housing portion that is connected to the front housing portion so as to form a watertight seal therebetween; a tray that is positioned between the front housing portion and the rear housing portion; a power source that is supported by the tray; a heatsink that is connected to the front housing portion and which is configured to distribute thermal energy through the image capture device; an integrated sensor-lens assembly (ISLA) that extends through the heatsink and which includes an image sensor and a lens that is positioned to receive and direct light onto the image sensor; a mounting member that is connected to the front housing portion and to the ISLA such that the ISLA is indirectly connected to the front housing portion via the mounting member; a printed circuit board (PCB) module that is connected to the heatsink; and a chassis.

The PCB module includes: a PCB assembly; a rear PCB assembly; and a flexible connector that extends between the front and rear PCB assemblies. The front and rear PCB assemblies each support one or more electrical and/or thermal components of the image capture device, and the flexible connector facilitates reconfiguration of the PCB module between a first configuration and a second configuration during assembly of the image capture device. In the first configuration, the front PCB assembly and the rear PCB assembly are oriented in non-parallel relation, and in the second configuration, the front PCB assembly and the rear PCB assembly are oriented in generally parallel relation.

The chassis is positioned between the front PCB assembly and the rear PCB assembly and includes a frame that structurally supports the PCB module.

In certain embodiments, the front housing portion may define a window that is configured to receive the mounting member such that the mounting member extends through the window and into the internal compartment.

In certain embodiments, the mounting member may include a front end portion that extends externally of the image capture device and a rear end portion that extends into the image capture device.

In certain embodiments, the ISLA may be connected to the rear end portion of the mounting member.

In certain embodiments, the front end portion of the mounting member may be configured for releasable connection to a cover for the image capture device such that the cover is connectable to and disconnectable from the image capture device via the mounting member.

In certain embodiments, the tray may define throughbores that are configured to receive mounts extending inwardly from the front housing portion.

In certain embodiments, the mounts may be configured to receive fasteners that connect the front housing portion to an interconnect mechanism.

In certain embodiments, the interconnect mechanism may be configured for engagement with an accessory such that the image capture device is connectable to the accessory via the interconnect mechanism.

In certain embodiments, the tray may include a front flange that engages the front housing portion and a rear flange that engages the rear housing portion.

In certain embodiments, the PCB module may be generally L-shaped in the first configuration and generally U-shaped in the second configuration.

In certain embodiments, the PCB module may define a generally U-shaped chamber in the second configuration that is configured to receive the chassis such that the chassis is positioned between the front PCB assembly and the rear PCB assembly.

In certain embodiments, the front PCB assembly and the rear PCB assembly may each include a rigid body with a laminated construction defined by layers that are arranged in adjacent relation.

In certain embodiments, the flexible connector may include a first end portion and a second end portion.

In certain embodiments, the first end portion may be positioned within the rigid body of the front PCB assembly between the layers thereof, and the second end portion may be positioned within the rigid body of the rear PCB assembly between the layers thereof.

In certain embodiments, the chassis may include at least one electrical connector (e.g., a USB connector).

In another aspect of the present disclosure, an image capture device is disclosed that includes: a front housing portion; a rear housing portion including a heatsink that is connected to the front housing portion; and a printed circuit board (PCB) module that is operatively connected to the front housing portion. The PCB module includes: a front PCB assembly; a rear PCB assembly; and a connector that extends between the front PCB assembly and the rear PCB assembly. The connector includes a flexible construction that facilitates reconfiguration of the PCB module during assembly of the image capture device between a first configuration, in which the front PCB assembly and the rear PCB assembly are oriented in non-parallel relation, and a second configuration, in which the front PCB assembly and the rear PCB assembly are oriented in generally parallel relation.

In certain embodiments, the rear PCB assembly may be thermally connected to the rear housing portion to facilitate thermal energy transfer from the rear PCB assembly to the heatsink.

In certain embodiments, the rear PCB assembly may include a system-on-chip and at least one power management integrated circuit.

In certain embodiments, the connector may include a first end portion that extends into the front PCB assembly and a second end portion that extends into the rear PCB assembly.

In certain embodiments, the front PCB assembly may be laminated in construction and may include layers that are positioned about the first end portion of the connector, and the rear PCB assembly may be laminated in construction and may include layers that are positioned about the second end portion of the connector.

In another aspect of the present disclosure, a method of assembling an image capture device is disclosed. The method includes: connecting a first heatsink to a front housing portion of the image capture device; inserting a printed circuit board (PCB) module including a front PCB assembly and a rear PCB assembly into the front housing portion with the PCB module in a first configuration in which the front PCB assembly and the rear PCB assembly are oriented in non-parallel relation; reconfiguring the PCB module from the first configuration into a second configuration in which the front PCB assembly and the rear PCB assembly are oriented in generally parallel relation; and connecting the PCB module to the first heatsink.

In certain embodiments, the method may further include thermally connecting the PCB module to a rear housing portion including a second heatsink, wherein the first heatsink and the second heatsink are formed as discrete components of the image capture device.

In certain embodiments, thermally connecting the PCB module to the rear housing portion may include thermally connecting the second heatsink to a system-on-chip and at least one power management integrated circuit.

In certain embodiments, reconfiguring the PCB module from the first configuration into the second configuration may include orienting at least one first component on the PCB module such that that the at least one first component is directed outwardly (e.g., towards the first heatsink and the second heatsink) and orienting at least one second component on the PCB module such that the at least one second component is directed inwardly (e.g., away from the first heatsink and the second heatsink).

In certain embodiments, the at least one first component may include a system-on-chip and at least one power management integrated circuit, and the at least one second component may include at least one integrated circuit.

In certain embodiments, the method may further include thermally connecting the at least one first component to the first heatsink and the second heatsink.

BRIEF DESCRIPTION OF THE DRAWINGS

The present disclosure is best understood from the following detailed description when read in conjunction with the accompanying drawings. According to common practice, the various features of the drawings may not be to-scale, and the dimensions of the various features may be arbitrarily expanded or reduced. Additionally, in the interest of clarity, certain components, elements, and/or features may be omitted from certain drawings in the interest of clarity.

FIG. 13 is a partial, vertical, cross-sectional view of the image capture device seen in FIG. 4 illustrating engagement between the front housing portion and the tray.

FIG. 14 is a partial, vertical, cross-sectional view of the image capture device seen in FIG. 4 illustrating engagement between the rear housing portion and the tray.

DETAILED DESCRIPTION

The present disclosure describes an image capture device including a bucket architecture that contributes to a reduction in the overall form factor of the image capture device and simplifies the assembly process. The reduced form factor of the image capture device facilitated by the bucket architecture described herein not only allows for improved mounting schemes, but supports mounting to an increased variety of accessories. For example, the reduced form factor increases user comfort when the image capture device is used with a wearable accessory (e.g., a helmet, etc.), as compared to known image capture devices, which often create a more awkward, uncomfortable, and cumbersome experience due to their larger size and increased weight.

The image capture device described herein includes a rear housing portion and a front housing portion (e.g., a bucket) that is configured to receive the various internal components of the image capture device (e.g., the heatsink, the ISLA, etc.) in a single (e.g., forward, front) direction of insertion. To facilitate such insertion and connection of the various internal components to the front housing portion in the manner described herein, the image capture device includes a reconfigurable PCB module having front and rear PCB assemblies and a (flexible) connector that extends therebetween. The flexible construction of the connector allows for deformation thereof (e.g., bending), which facilitates reconfiguration of the PCB module between first and second configurations during assembly of the image capture device. In the first configuration, the front and rear PCB assemblies are oriented in non-parallel relation, and in the second configuration, the front and rear PCB assemblies are oriented in generally parallel relation. More specifically, in the first configuration, the PCB module includes a generally L-shaped configuration, whereas in the second configuration, the PCB module includes a generally U-shaped configuration in which the front and rear PCB assemblies collectively define a (generally U-shaped) chamber therebetween. The generally U-shaped second configuration of the PCB module allows various electrical and/or thermal components of the image capture device to be included on a single PCB module. The incorporation of a single, reconfigurable PCB module allows for a more compact internal design and, thus, further reductions in the overall form factor of the image capture device, and simplifies the overall assembly process by improving not only access to the internal component(s) (e.g., those housed (accommodated) between the front and rear PCB assemblies), but visibility of the internal component(s) as well by reducing (if not entirely eliminating) blind steps.

Figure 1A:
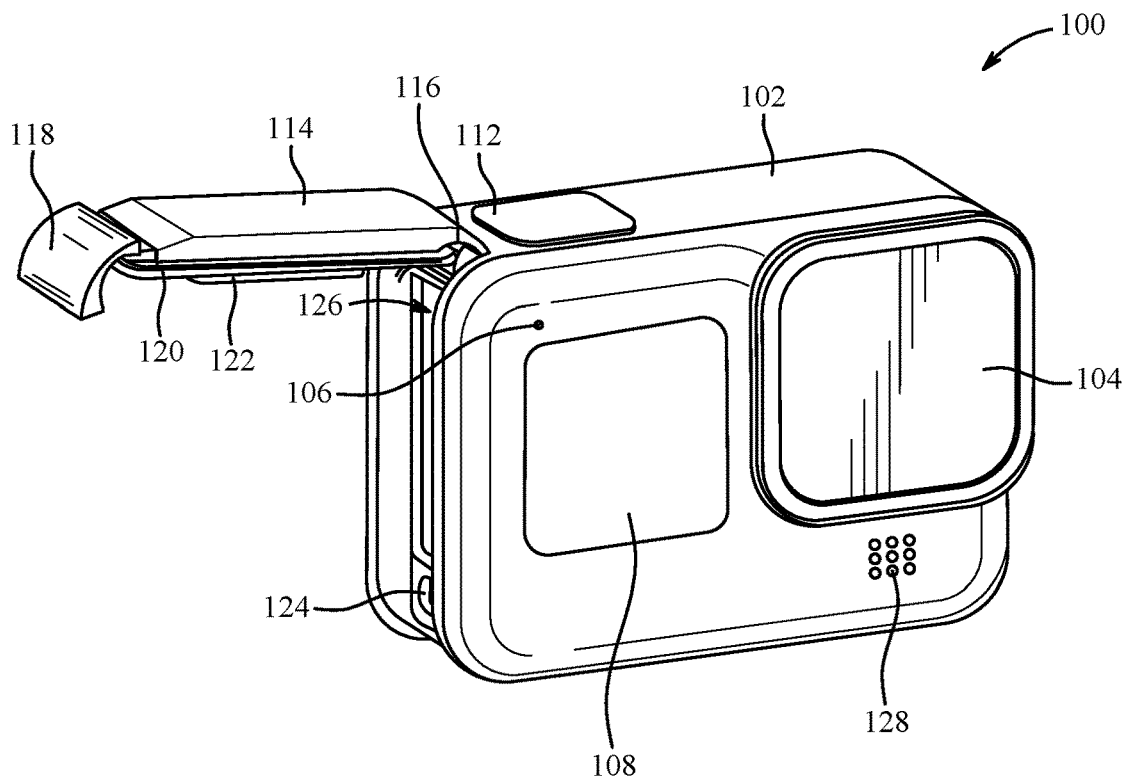
FIGS. 1A-B are isometric views of an example of an image capture device.
Figure 1B:
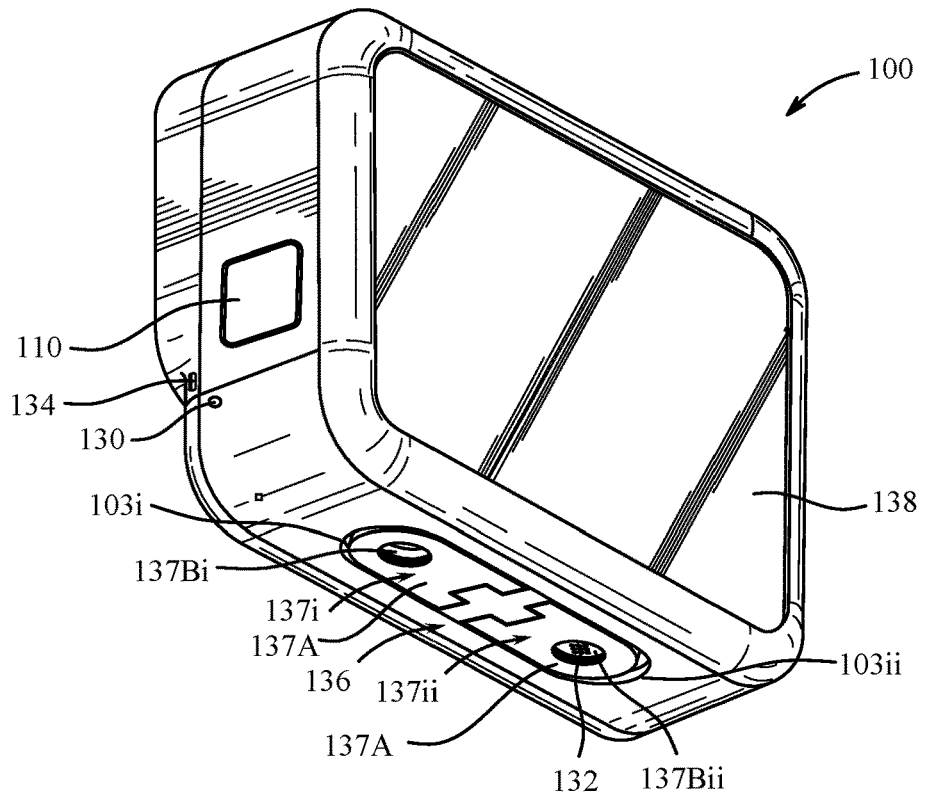

FIGS. 1A-B are isometric views of an example of an image capture device 100. The image capture device 100 may include a body 102, one or more lenses 104 structured on a front surface of the body 102, various indicators on the front surface of the body 102 (such as light-emitting diodes (LEDs), displays, and the like), various input mechanisms (such as buttons, switches, and/or touch-screens), and electronics (such as imaging electronics, power electronics, etc.) internal to the body 102 for capturing images via the lens(es) 104 and/or performing other functions. The lens(es) 104 receive light incident upon the lens(es) 104 and to direct received light onto an image sensor internal to the body 102, as described in further detail below. The image capture device 100 may be configured to capture images and video and to store captured images and video for subsequent display or playback.

The image capture device 100 may include an LED or another form of indicator 106 to indicate a status of the image capture device 100 and a liquid-crystal display (LCD) or other form of a display 108 to show status information such as battery life, camera mode, elapsed time, and the like. The image capture device 100 may also include a mode button 110 and a shutter button 112 that are configured to allow a user of the image capture device 100 to interact with the image capture device 100. For example, the mode button 110 and the shutter button 112 may be used to turn the image capture device 100 on and off, scroll through modes and settings, and select modes and change settings. The image capture device 100 may include additional buttons or interfaces (not shown) to support and/or control additional functionality.

The image capture device 100 may include a door 114 coupled to the body 102, for example, using a hinge mechanism 116. The door 114 may be secured to the body 102 using a latch mechanism 118 that releasably engages the body 102 at a position generally opposite the hinge mechanism 116. The door 114 may also include a seal 120 and a battery interface 122. When the door 114 is an open position, access is provided to an input-output (I/O) interface 124 for connecting to or communicating with external devices as described below and to a battery receptacle 126 for placement and replacement of a battery (not shown). The battery receptacle 126 includes operative connections (not shown) for power transfer between the battery and the image capture device 100. When the door 114 is in a closed position, the seal 120 engages a flange (not shown) or other interface to provide an environmental seal, and the battery interface 122 engages the battery to secure the battery in the battery receptacle 126. The door 114 can also have a removed position (not shown) where the entire door 114 is separated from the image capture device 100, that is, where both the hinge mechanism 116 and the latch mechanism 118 are decoupled from the body 102 to allow the door 114 to be removed from the image capture device 100.

The image capture device 100 may include a microphone 128 on a front surface and another microphone 130 on a side surface. The image capture device 100 may include other microphones on other surfaces (not shown). The microphones 128, 130 may be configured to receive and record audio signals in conjunction with recording video or separate from recording of video. The image capture device 100 may include a speaker 132 on a bottom surface of the image capture device 100. The image capture device 100 may include other speakers on other surfaces (not shown). The speaker 132 may be configured to play back recorded audio or emit sounds associated with notifications.

A front surface of the image capture device 100 may include a drainage channel 134. A bottom surface of the image capture device 100 may include a (first) interconnect mechanism 136 that is configured for engagement with (connecting to) an accessory, handle, grip, etc., such that the image capture device 100 is (repeatably) connectable to the accessory via the interconnect mechanism 136. In the example shown in FIG. 1B, the interconnect mechanism 136 includes folding protrusions 137 (e.g., fingers 137A) that are configured to move between a nested (collapsed) position (FIG. 1B) and an extended (open) position (FIGS. 2A, 2B) that facilitates coupling of the protrusions 137 to mating protrusions of other devices such as accessories, handle grips, mounts, clips, or like devices, as discussed in further detail below. More specifically, the interconnect mechanism 136 includes a (first) protrusion 137$i$ defining a (first) opening 137Bi and a (second) protrusion 137$ii$ defining a (second) opening 137Bii, which are moveable between the nested and extended positions independently of each other. As seen in FIG. 1B, for example, when the protrusions 137 are in the nested position, the protrusions 137 are received within (accommodated by) corresponding cavities 103, which extend (vertically upward) into the body 102 (e.g., towards the shutter button 112), and when the protrusions 137 are in the extended position, the protrusions 137 are removed from the cavities 103 such that the protrusions 137 extend (vertically downward) from the body (e.g., away from the shutter button 112). More specifically, the body 102 includes a (first) cavity 103$i$ that is configured to receive the protrusion 137*i* when the protrusion 137*i* is in the nested position and a (second) cavity 103*ii* that is configured to receive the protrusion 137*ii* when the protrusion 137*ii* is in the nested position. To facilitate reception of the protrusions 137, the cavities 103 include identical (or generally identical) configurations, which correspond to those defined by the protrusions 137. As such, in the illustrated embodiment, the cavities 103 each include a D-shaped (or generally D-shaped) transverse (e.g., horizontal) cross-sectional configuration. It should be appreciated, however, that the particular configurations of the protrusions 137 and the cavities 103 may be altered in various embodiments without departing from the scope of the present disclosure.

The image capture device 100 may include an interactive display 138 that allows for interaction with the image capture device 100 while simultaneously displaying information on a surface of the image capture device 100.

The image capture device 100 of FIGS. 1A-B includes an exterior that encompasses and protects internal electronics. In the present example, the exterior includes six surfaces (i.e., a front face, a left face, a right face, a back face, a top face, and a bottom face) that form a rectangular cuboid. Furthermore, both the front and rear surfaces of the image capture device 100 are rectangular. In other embodiments, the exterior may have a different shape. The image capture device 100 may be made of a rigid material such as plastic, aluminum, steel, or fiberglass. The image capture device 100 may include features other than those described here. For example, the image capture device 100 may include additional buttons or different interface features, such as interchangeable lenses, cold shoes, and hot shoes that can add functional features to the image capture device 100.

The image capture device 100 may include various types of image sensors, such as charge-coupled device (CCD) sensors, active pixel sensors (APS), complementary metal-oxide-semiconductor (CMOS) sensors, N-type metal-oxide-semiconductor (NMOS) sensors, and/or any other image sensor or combination of image sensors.

Although not illustrated, in various embodiments, the image capture device 100 may include other additional electrical components (e.g., an image processor, camera system-on-chip (SoC), etc.), which may be included on one or more circuit boards within the body 102 of the image capture device 100.

The image capture device 100 may interface with or communicate with an external device, such as an external user interface device (not shown), via a wired or wireless computing communication link (e.g., the I/O interface 124). Any number of computing communication links may be used. The computing communication link may be a direct computing communication link or an indirect computing communication link, such as a link including another device or a network, such as the internet, may be used.

In some implementations, the computing communication link may be a Wi-Fi link, an infrared link, a Bluetooth (BT) link, a cellular link, a ZigBee link, a near field communications (NFC) link, such as an ISO/IEC 20643 protocol link, an Advanced Network Technology interoperability (ANT+) link, and/or any other wireless communications link or combination of links.

In some implementations, the computing communication link may be an HDMI link, a USB link, a digital video interface link, a display port interface link, such as a Video Electronics Standards Association (VESA) digital display interface link, an Ethernet link, a Thunderbolt link, and/or other wired computing communication link.

The image capture device 100 may transmit images, such as panoramic images, or portions thereof, to the external user interface device via the computing communication link, and the external user interface device may store, process, display, or a combination thereof the panoramic images.

The external user interface device may be a computing device, such as a smartphone, a tablet computer, a phablet, a smart watch, a portable computer, personal computing device, and/or another device or combination of devices configured to receive user input, communicate information with the image capture device 100 via the computing communication link, or receive user input and communicate information with the image capture device 100 via the computing communication link.

The external user interface device may display, or otherwise present, content, such as images or video, acquired by the image capture device 100. For example, a display of the external user interface device may be a viewport into the three-dimensional space represented by the panoramic images or video captured or created by the image capture device 100.

The external user interface device may communicate information, such as metadata, to the image capture device 100. For example, the external user interface device may send orientation information of the external user interface device with respect to a defined coordinate system to the image capture device 100, such that the image capture device 100 may determine an orientation of the external user interface device relative to the image capture device 100.

Based on the determined orientation, the image capture device 100 may identify a portion of the panoramic images or video captured by the image capture device 100 for the image capture device 100 to send to the external user interface device for presentation as the viewport. In some implementations, based on the determined orientation, the image capture device 100 may determine the location of the external user interface device and/or the dimensions for viewing of a portion of the panoramic images or video.

The external user interface device may implement or execute one or more applications to manage or control the image capture device 100. For example, the external user interface device may include an application for controlling camera configuration, video acquisition, video display, or any other configurable or controllable aspect of the image capture device 100.

The user interface device, such as via an application, may generate and share, such as via a cloud-based or social media service, one or more images, or short video clips, such as in response to user input. In some implementations, the external user interface device, such as via an application, may remotely control the image capture device 100 such as in response to user input.

The external user interface device, such as via an application, may display unprocessed or minimally processed images or video captured by the image capture device 100 contemporaneously with capturing the images or video by the image capture device 100, such as for shot framing or live preview, and which may be performed in response to user input. In some implementations, the external user interface device, such as via an application, may mark one or more key moments contemporaneously with capturing the images or video by the image capture device 100, such as with a tag or highlight in response to a user input or user gesture.

The external user interface device, such as via an application, may display or otherwise present marks or tags associated with images or video, such as in response to user input. For example, marks may be presented in a camera roll application for location review and/or playback of video highlights.

The external user interface device, such as via an application, may wirelessly control camera software, hardware, or both. For example, the external user interface device may include a web-based graphical interface accessible by a user for selecting a live or previously recorded video stream from the image capture device 100 for display on the external user interface device.

The external user interface device may receive information indicating a user setting, such as an image resolution setting (e.g., 3840 pixels by 2160 pixels), a frame rate setting (e.g., 60 frames per second (fps)), a location setting, and/or a context setting, which may indicate an activity, such as mountain biking, in response to user input, and may communicate the settings, or related information, to the image capture device 100.

Figure 2A:
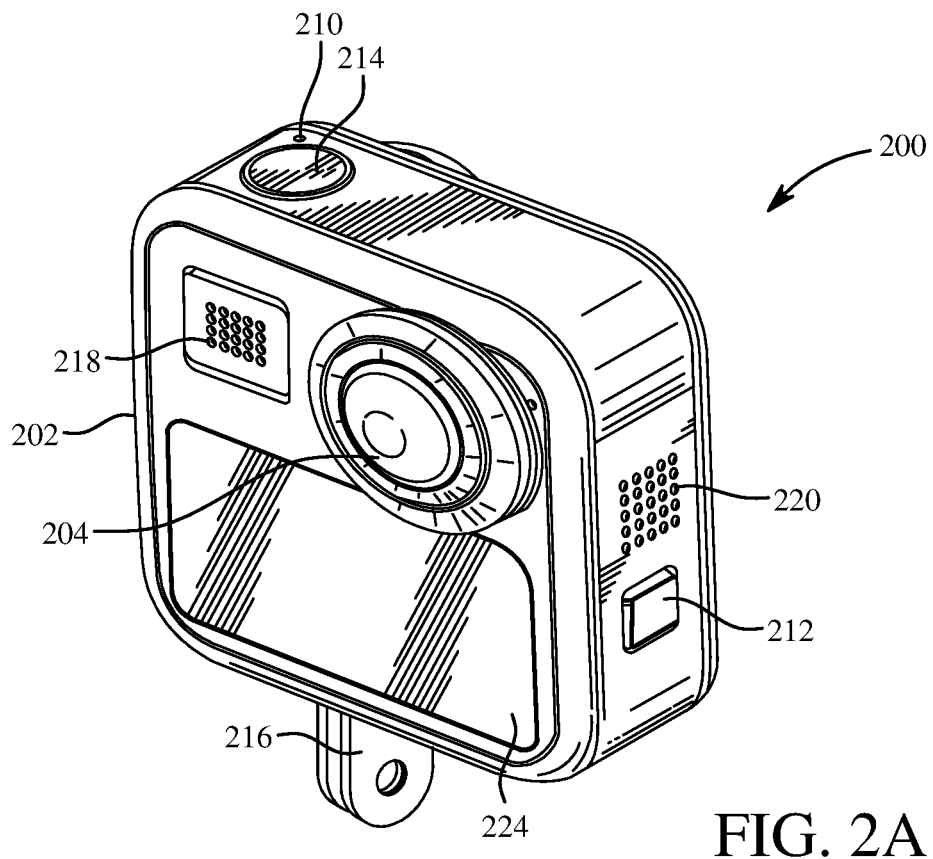
FIGS. 2A-B are isometric views of another example of an image capture device.
Figure 2B:
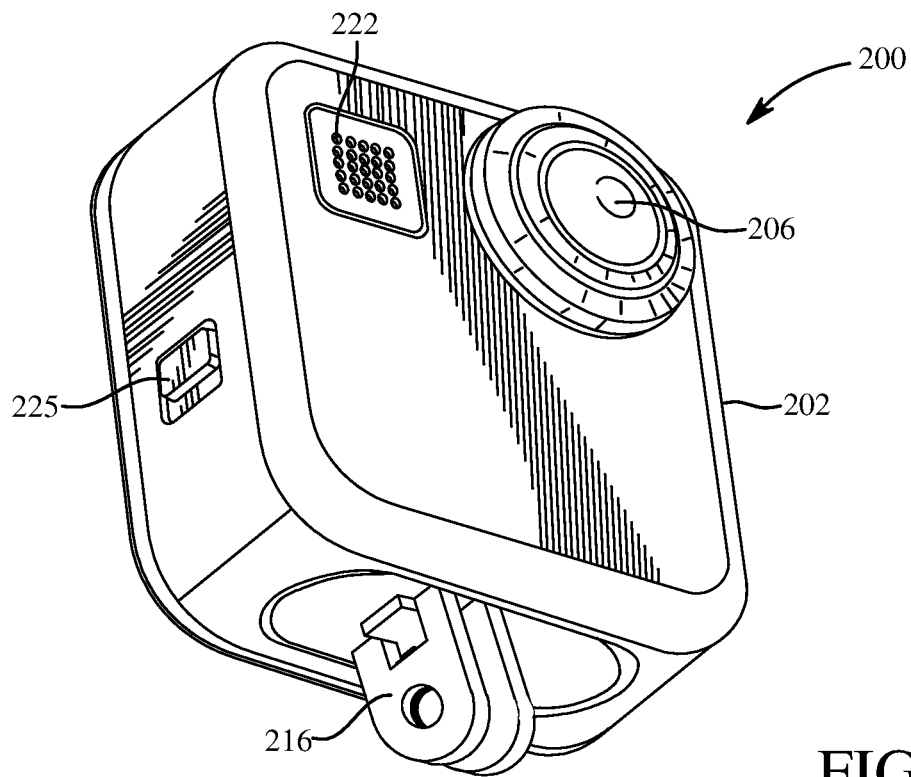

FIGS. 2A-B illustrate another example of an image capture device 200. The image capture device 200 includes a body 202 and two camera lenses 204 and 206 disposed on opposing surfaces of the body 202, for example, in a back-to-back configuration, Janus configuration, or offset Janus configuration. The body 202 of the image capture device 200 may be made of a rigid material such as plastic, aluminum, steel, or fiberglass.

The image capture device 200 includes various indicators on the front of the surface of the body 202 (such as LEDs, displays, and the like), various input mechanisms (such as buttons, switches, and touch-screen mechanisms), and electronics (e.g., imaging electronics, power electronics, etc.) internal to the body 202 that are configured to support image capture via the two camera lenses 204 and 206 and/or perform other imaging functions.

The image capture device 200 includes various indicators, for example, LEDs 208, 210 to indicate a status of the image capture device 100. The image capture device 200 may include a mode button 212 and a shutter button 214 configured to allow a user of the image capture device 200 to interact with the image capture device 200, to turn the image capture device 200 on, and to otherwise configure the operating mode of the image capture device 200. It should be appreciated, however, that, in alternate embodiments, the image capture device 200 may include additional buttons or inputs to support and/or control additional functionality.

The image capture device 200 may include an interconnect mechanism 216 for connecting the image capture device 200 to a handle grip or other securing device. In the example shown in FIGS. 2A and 2B, the interconnect mechanism 216 includes folding protrusions configured to move between a nested or collapsed position (not shown) and an extended or open position as shown that facilitates coupling of the protrusions to mating protrusions of other devices such as handle grips, mounts, clips, or like devices.

The image capture device 200 may include audio components 218, 220, 222 such as microphones configured to receive and record audio signals (e.g., voice or other audio commands) in conjunction with recording video. The audio component 218, 220, 222 can also be configured to play back audio signals or provide notifications or alerts, for example, using speakers. Placement of the audio components 218, 220, 222 may be on one or more of several surfaces of the image capture device 200. In the example of FIGS. 2A and 2B, the image capture device 200 includes three audio components 218, 220, 222, with the audio component 218 on a front surface, the audio component 220 on a side surface, and the audio component 222 on a back surface of the image capture device 200. Other numbers and configurations for the audio components are also possible.

The image capture device 200 may include an interactive display 224 that allows for interaction with the image capture device 200 while simultaneously displaying information on a surface of the image capture device 200. The interactive display 224 may include an I/O interface, receive touch inputs, display image information during video capture, and/or provide status information to a user. The status information provided by the interactive display 224 may include battery power level, memory card capacity, time elapsed for a recorded video, etc.

The image capture device 200 may include a release mechanism 225 that receives a user input to in order to change a position of a door (not shown) of the image capture device 200. The release mechanism 225 may be used to open the door (not shown) in order to access a battery, a battery receptacle, an I/O interface, a memory card interface, etc. (not shown) that are similar to components described in respect to the image capture device 100 of FIGS. 1A and 1B.

In some embodiments, the image capture device 200 described herein includes features other than those described. For example, instead of the I/O interface and the interactive display 224, the image capture device 200 may include additional interfaces or different interface features. For example, the image capture device 200 may include additional buttons or different interface features, such as interchangeable lenses, cold shoes, and hot shoes that can add functional features to the image capture device 200.

Figure 3:
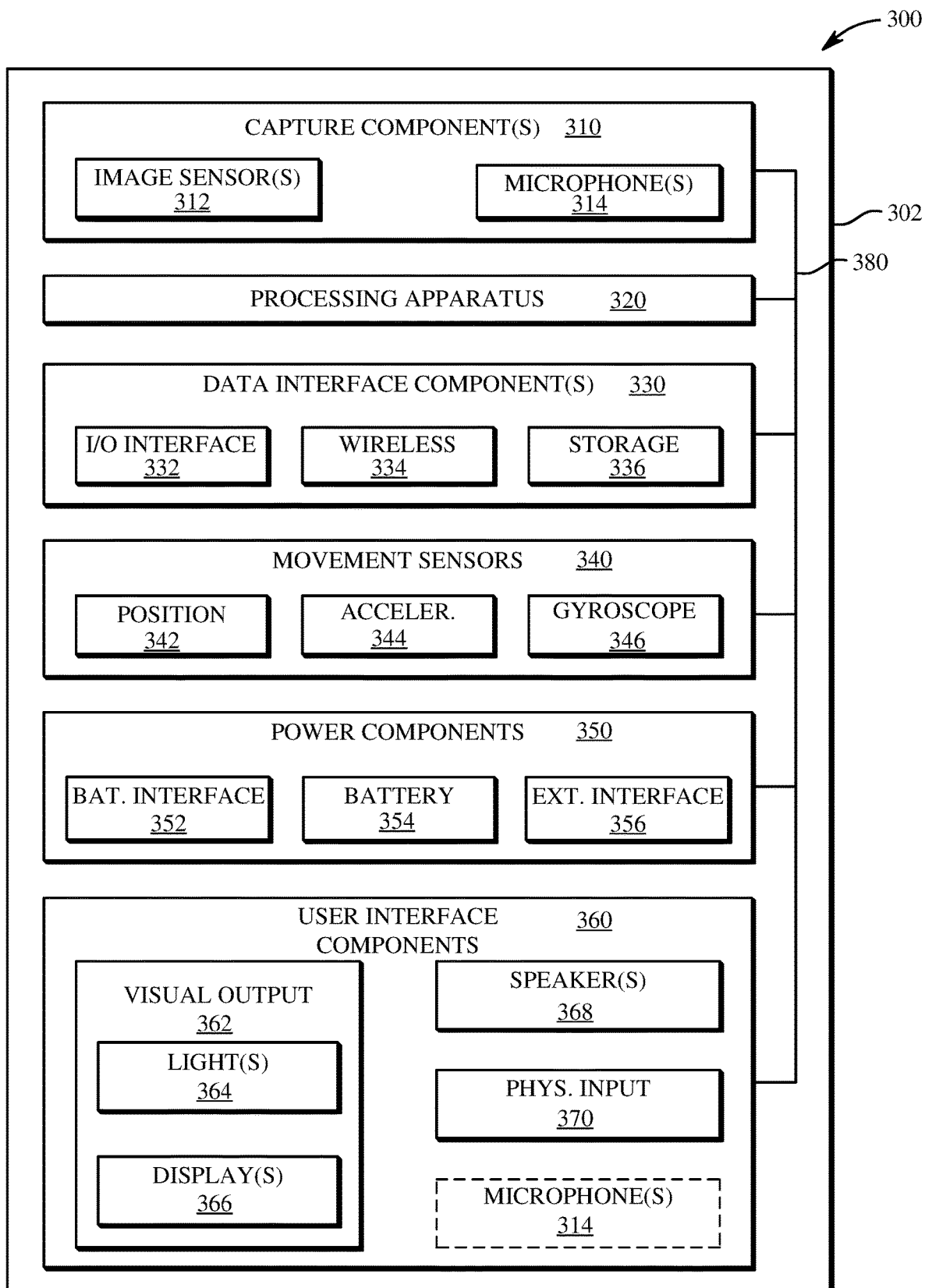
FIG. 3 is a block diagram of electronic components of an image capture device.

FIG. 3 is a block diagram of electronic components in an image capture device 300. The image capture device 300 may be a single-lens image capture device, a multi-lens image capture device, or variations thereof, including an image capture device with multiple capabilities such as use of interchangeable integrated sensor lens assemblies. The description of the image capture device 300 is also applicable to the image capture devices 100, 200 of FIGS. 1A-B and 2A-D.

The image capture device 300 includes a body 302 which includes electronic components such as capture components 310, a processing apparatus 320, data interface components 330, movement sensors 340, power components 350, and/or user interface components 360.

The capture components 310 include one or more image sensors 312 for capturing images and one or more microphones 314 for capturing audio.

The image sensor(s) 312 is configured to detect light of a certain spectrum (e.g., the visible spectrum or the infrared spectrum) and convey information constituting an image as electrical signals (e.g., analog or digital signals). The image sensor(s) 312 detects light incident through a lens coupled or connected to the body 302. The image sensor(s) 312 may be any suitable type of image sensor, such as a charge-coupled device (CCD) sensor, active pixel sensor (APS), complementary metal-oxide-semiconductor (CMOS) sensor, N-type metal-oxide-semiconductor (NMOS) sensor, and/or any other image sensor or combination of image sensors. Image signals from the image sensor(s) 312 may be passed to other electronic components of the image capture device 300 via a bus 380, such as to the processing apparatus 320. In some implementations, the image sensor(s) 312 includes a digital-to-analog converter. A multi-lens variation of the image capture device 300 can include multiple image sensors 312.

The microphone(s) 314 is configured to detect sound, which may be recorded in conjunction with capturing images to form a video. The microphone(s) 314 may also detect sound in order to receive audible commands to control the image capture device 300.

The processing apparatus 320 may be configured to perform image signal processing (e.g., filtering, tone mapping, stitching, and/or encoding) to generate output images based on image data from the image sensor(s) 312. The processing apparatus 320 may include one or more processors having single or multiple processing cores. In some implementations, the processing apparatus 320 may include an application specific integrated circuit (ASIC). For example, the processing apparatus 320 may include a custom image signal processor. The processing apparatus 320 may exchange data (e.g., image data) with other components of the image capture device 300, such as the image sensor(s) 312, via the bus 380.

The processing apparatus 320 may include memory, such as a random-access memory (RAM) device, flash memory, or another suitable type of storage device, such as a non-transitory computer-readable memory. The memory of the processing apparatus 320 may include executable instructions and data that can be accessed by one or more processors of the processing apparatus 320. For example, the processing apparatus 320 may include one or more dynamic random-access memory (DRAM) modules, such as double data rate synchronous dynamic random-access memory (DDR SDRAM). In some implementations, the processing apparatus 320 may include a digital signal processor (DSP). More than one processing apparatus may also be present or associated with the image capture device 300.

The data interface components 330 enable communication between the image capture device 300 and other electronic devices, such as a remote control, a smartphone, a tablet computer, a laptop computer, a desktop computer, or a storage device. For example, the data interface components 330 may be used to receive commands to operate the image capture device 300, transfer image data to other electronic devices, and/or transfer other signals or information to and from the image capture device 300. The data interface components 330 may be configured for wired and/or wireless communication. For example, the data interface components 330 may include an I/O interface 332 that provides wired communication for the image capture device, which may be a USB interface (e.g., USB type-C), a high-definition multimedia interface (HDMI), or a FireWire interface. The data interface components 330 may include a wireless data interface 334 that provides wireless communication for the image capture device 300, such as a Bluetooth interface, a ZigBee interface, and/or a Wi-Fi interface. The data interface components 330 may include a storage interface 336, such as a memory card slot configured to receive and operatively couple to a storage device (e.g., a memory card) for data transfer with the image capture device 300 (e.g., for storing captured images and/or recorded audio and video).

The movement sensors 340 may detect the position and movement of the image capture device 300. The movement sensors 340 may include a position sensor 342, an accelerometer 344, or a gyroscope 346. The position sensor 342, such as a global positioning system (GPS) sensor, is used to determine a position of the image capture device 300. The accelerometer 344, such as a three-axis accelerometer, measures linear motion (e.g., linear acceleration) of the image capture device 300. The gyroscope 346, such as a three-axis gyroscope, measures rotational motion (e.g., rate of rotation) of the image capture device 300. Other types of movement sensors 340 may also be present or associated with the image capture device 300.

The power components 350 may receive, store, and/or provide power for operating the image capture device 300. The power components 350 may include a battery interface 352 and a battery 354. The battery interface 352 operatively couples to the battery 354, for example, with conductive contacts to transfer power from the battery 354 to the other electronic components of the image capture device 300. The power components 350 may also include an external interface 356, and the power components 350 may, via the external interface 356, receive power from an external source, such as a wall plug or external battery, for operating the image capture device 300 and/or charging the battery 354 of the image capture device 300. In some implementations, the external interface 356 may be the I/O interface 332. In such an implementation, the I/O interface 332 may enable the power components 350 to receive power from an external source over a wired data interface component (e.g., a USB type-C cable).

The user interface components 360 may allow the user to interact with the image capture device 300, for example, providing outputs to the user and receiving inputs from the user. The user interface components 360 may include visual output components 362 to visually communicate information and/or present captured images to the user. The visual output components 362 may include one or more lights 364 and/or more displays 366. The display(s) 366 may be configured as a touch screen that receives inputs from the user. The user interface components 360 may also include one or more speakers 368. The speaker(s) 368 can function as an audio output component that audibly communicates information and/or presents recorded audio to the user. The user interface components 360 may also include one or more physical input interfaces 370 that are physically manipulated by the user to provide input to the image capture device 300. The physical input interfaces 370 may, for example, be configured as buttons, toggles, or switches. The user interface components 360 may also be considered to include the microphone(s) 314, as indicated in dotted line, and the microphone(s) 314 may function to receive audio inputs from the user, such as voice commands.

Referring now to FIGS. 4-12, an image capture device 400 is illustrated, which includes features similar to the aforedescribed image capture devices 100, 200, 300 and, accordingly, will only be discussed with respect to differences therefrom in the interest of brevity. The image capture device 400 includes: a front housing portion 402 (e.g., a bucket 404); a rear housing portion 406 that is connected to the front housing portion 402 so as to form a watertight seal therebetween; a (removable) cover 500; and a variety of internal components, both structural and electrical. As described in detail below, the internal components of the image capture device 400 include: a tray 600 that is positioned between the housing portions 402, 406; a power source 700 (e.g., the aforementioned battery 354 (FIG. 3)); a mounting member 800 (e.g., a bayonet 802); a (first) sealing member 900; an integrated sensor-lens assembly (ISLA) 1000; a (second) sealing member 1100; a (first, front) heatsink 1200, which is supported by (e.g., connected to) the front housing portion 402 and is configured to distribute thermal energy through the image capture device 400; a reconfigurable printed circuit board (PCB) module 1300; and a chassis 1400.

Figure 4:
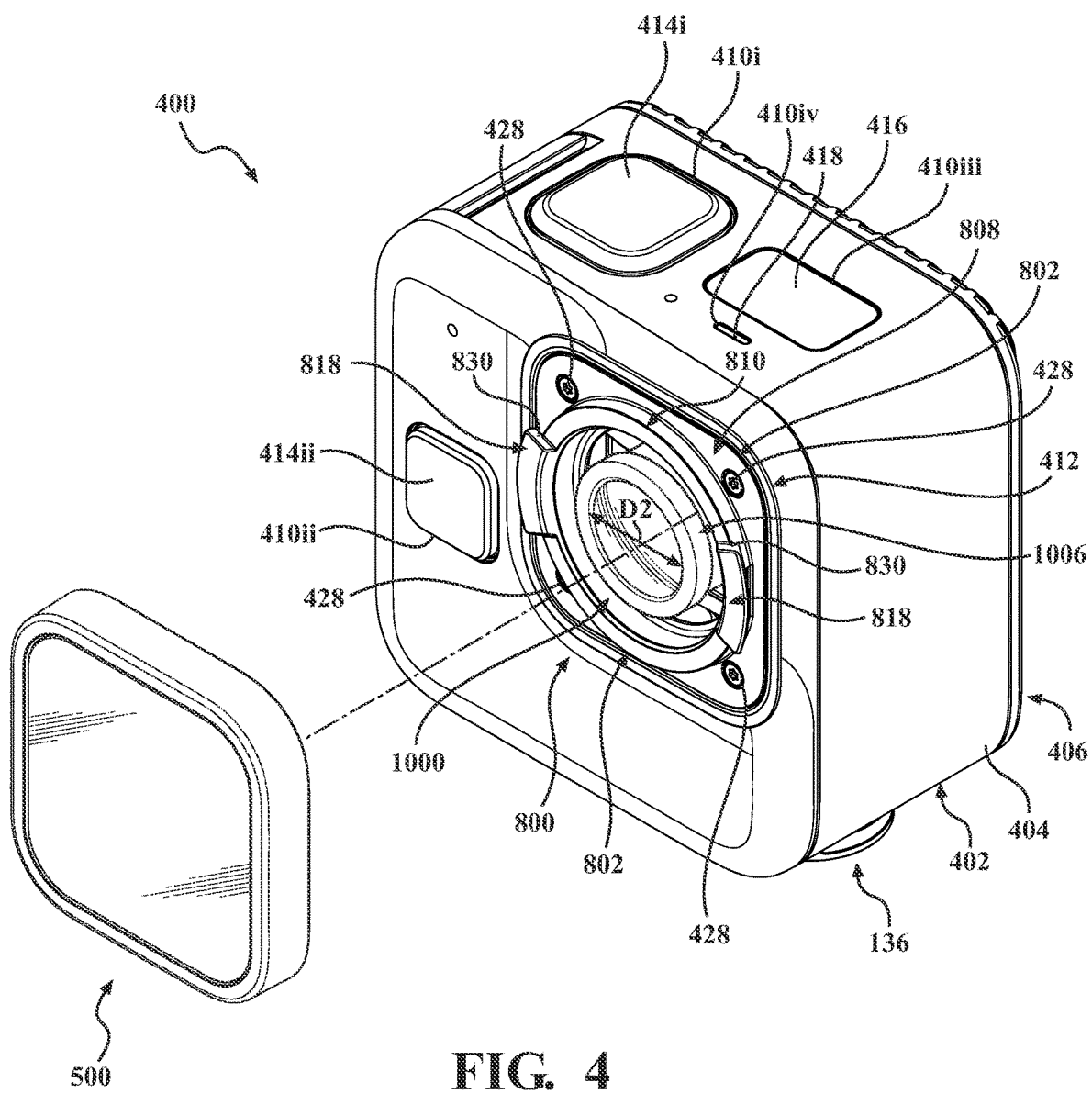
FIG. 4 is a front, perspective view of another example of an image capture device.
Figure 5:
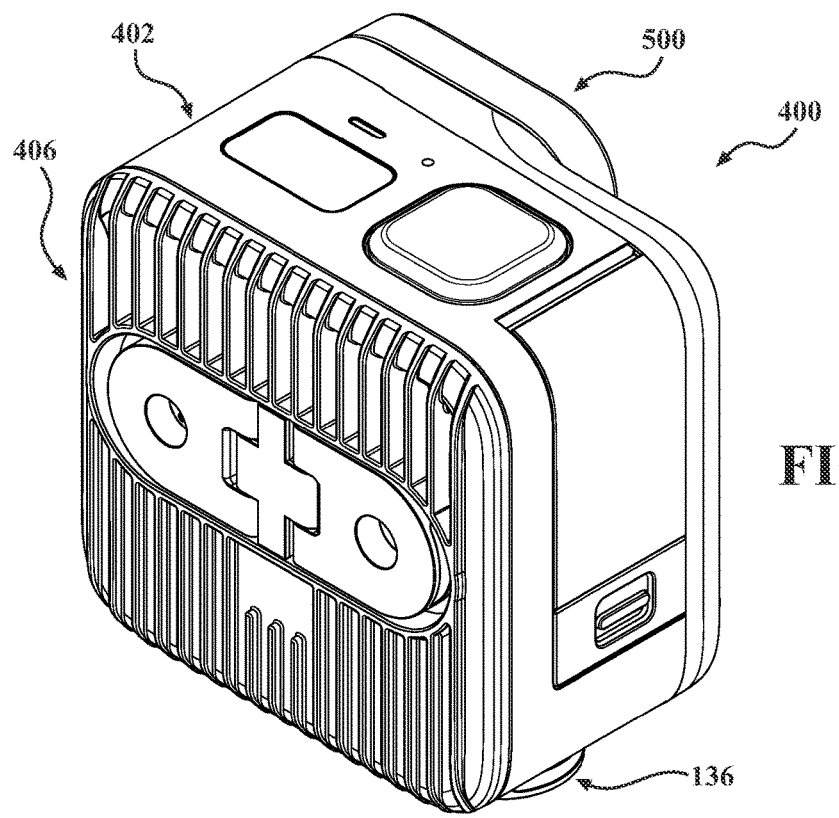
FIG. 5 is a rear, perspective view of the image capture device seen in FIG. 4.
Figure 6:
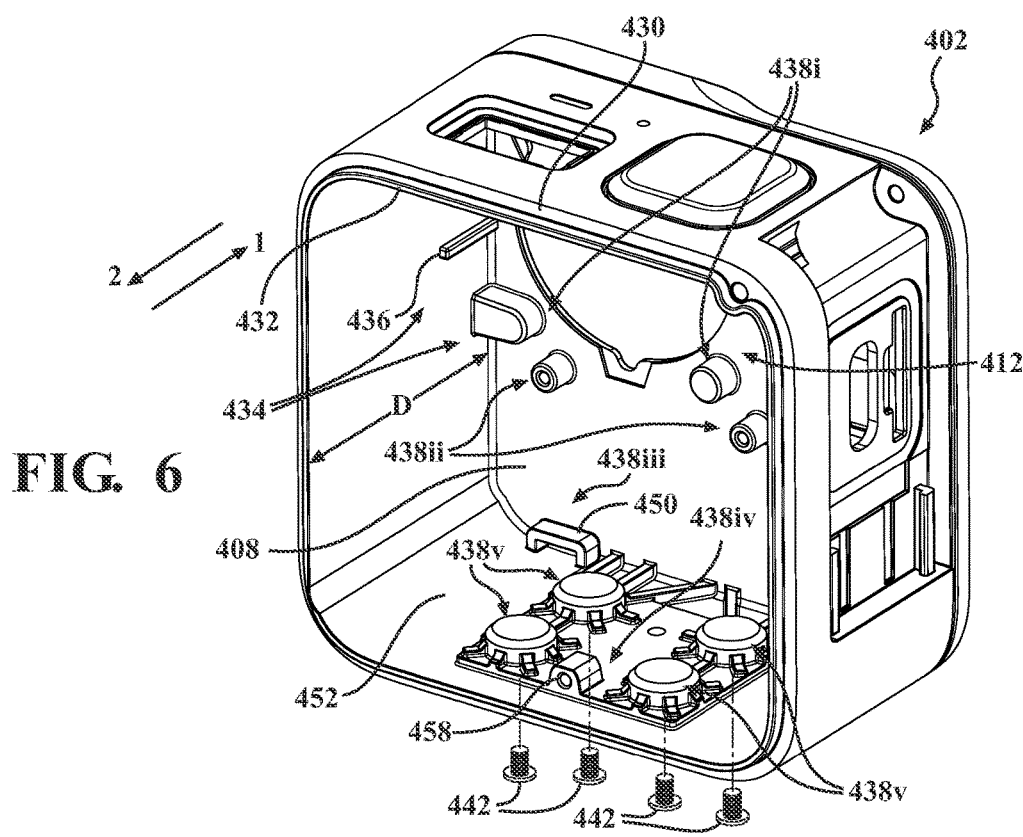
FIG. 6 is a rear, perspective view of a front housing portion of the image capture device seen in FIG. 4.
Figure 7:
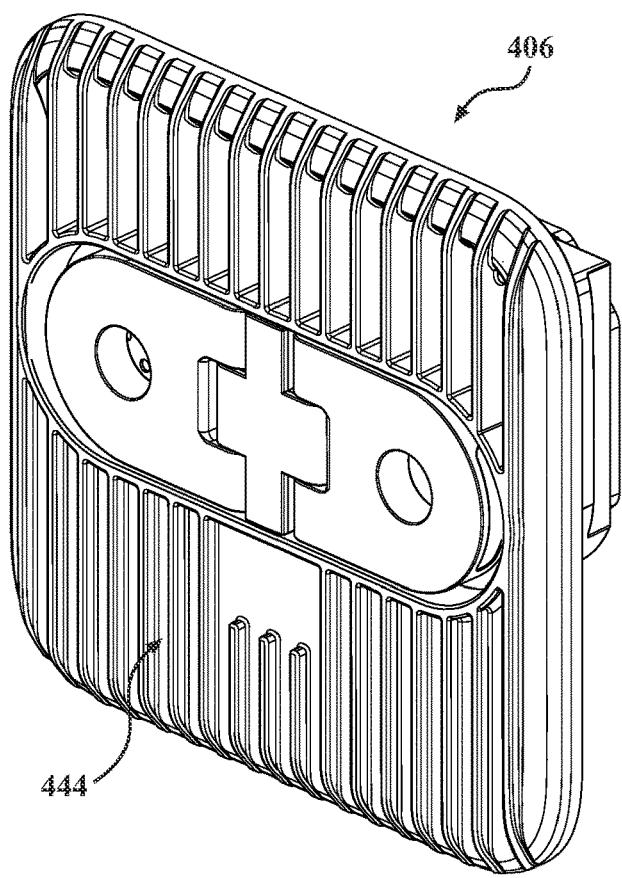
FIG. 7 is a rear, perspective view of a rear housing portion of the image capture device seen in FIG. 4.
Figure 8:
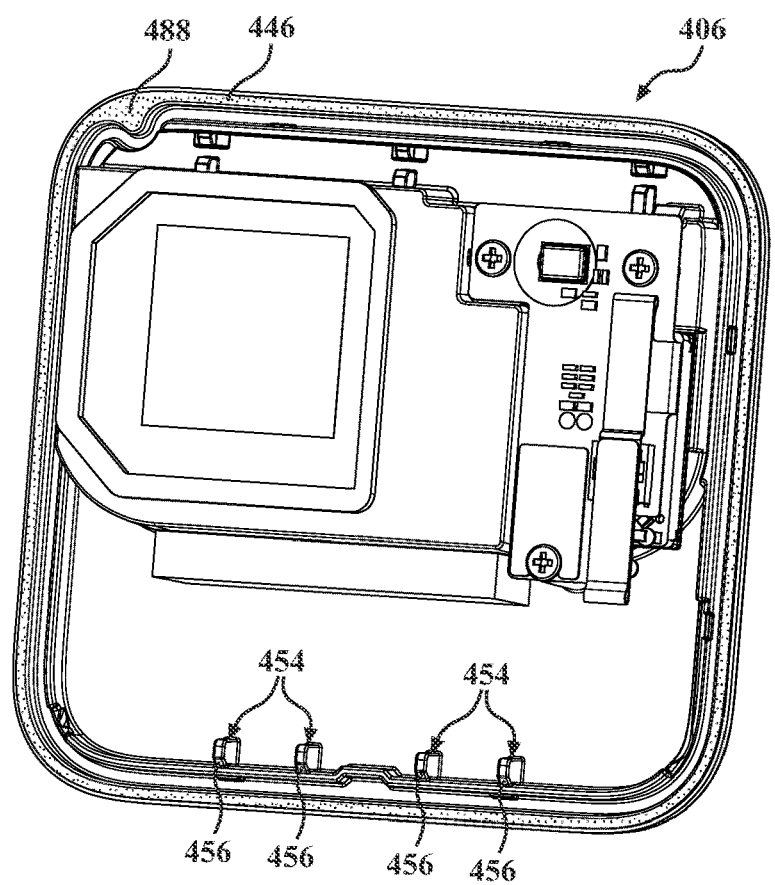
FIG. 8 is a front, perspective view of the rear housing portion seen in FIG. 7.
Figure 9:
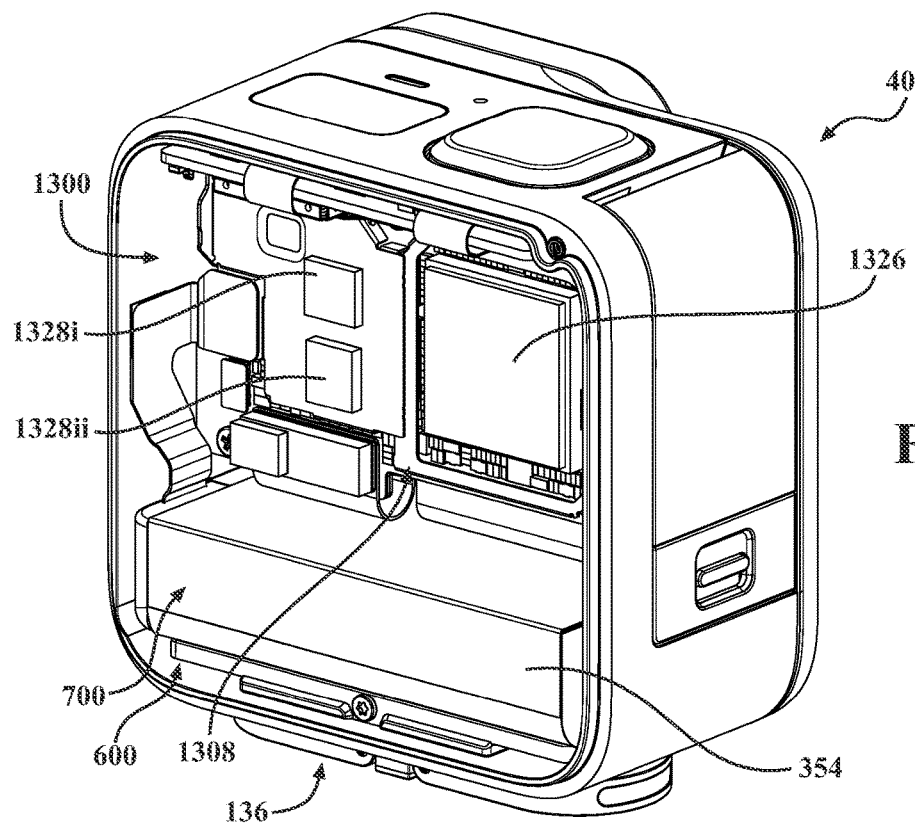
FIG. 9 is a rear, perspective view of the of the image capture device seen in FIG. 4 with the rear housing portion removed and illustrating a power source, a tray supporting the power source, and a PCB module.
Figure 10:
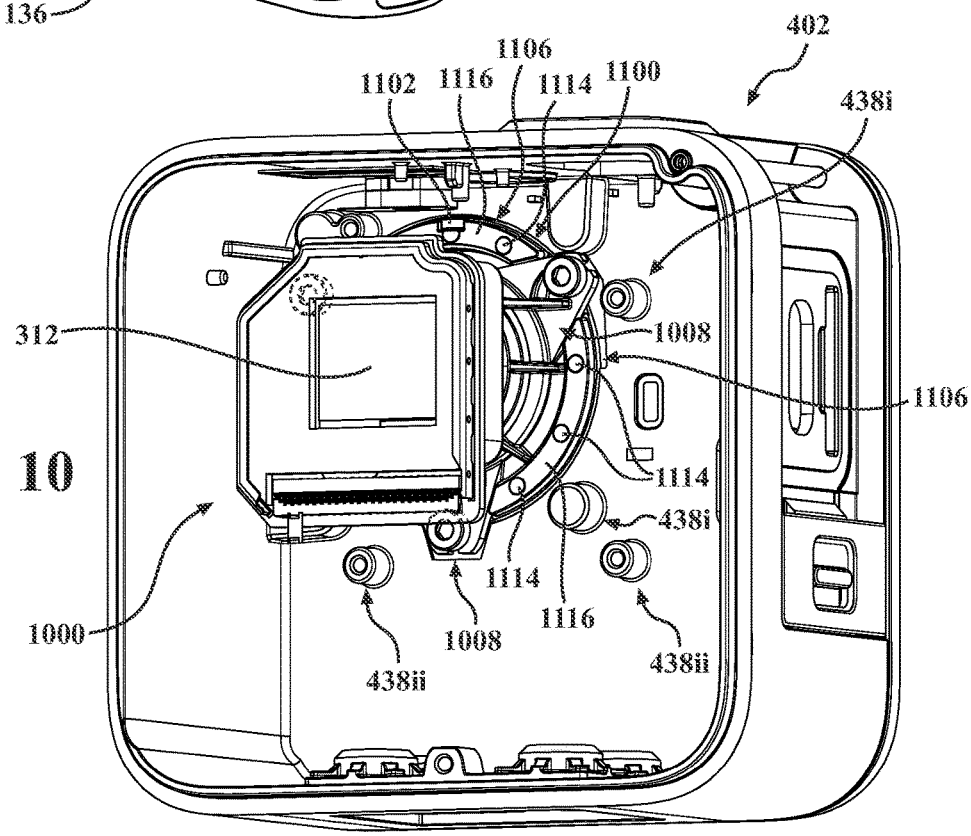
FIG. 10 is a rear, perspective view of the image capture device seen in FIG. 9 with the power source, the tray, and the PCB module removed and illustrating an integrated sensor-lens assembly (ISLA) shown connected to a mounting member.
Figure 11:
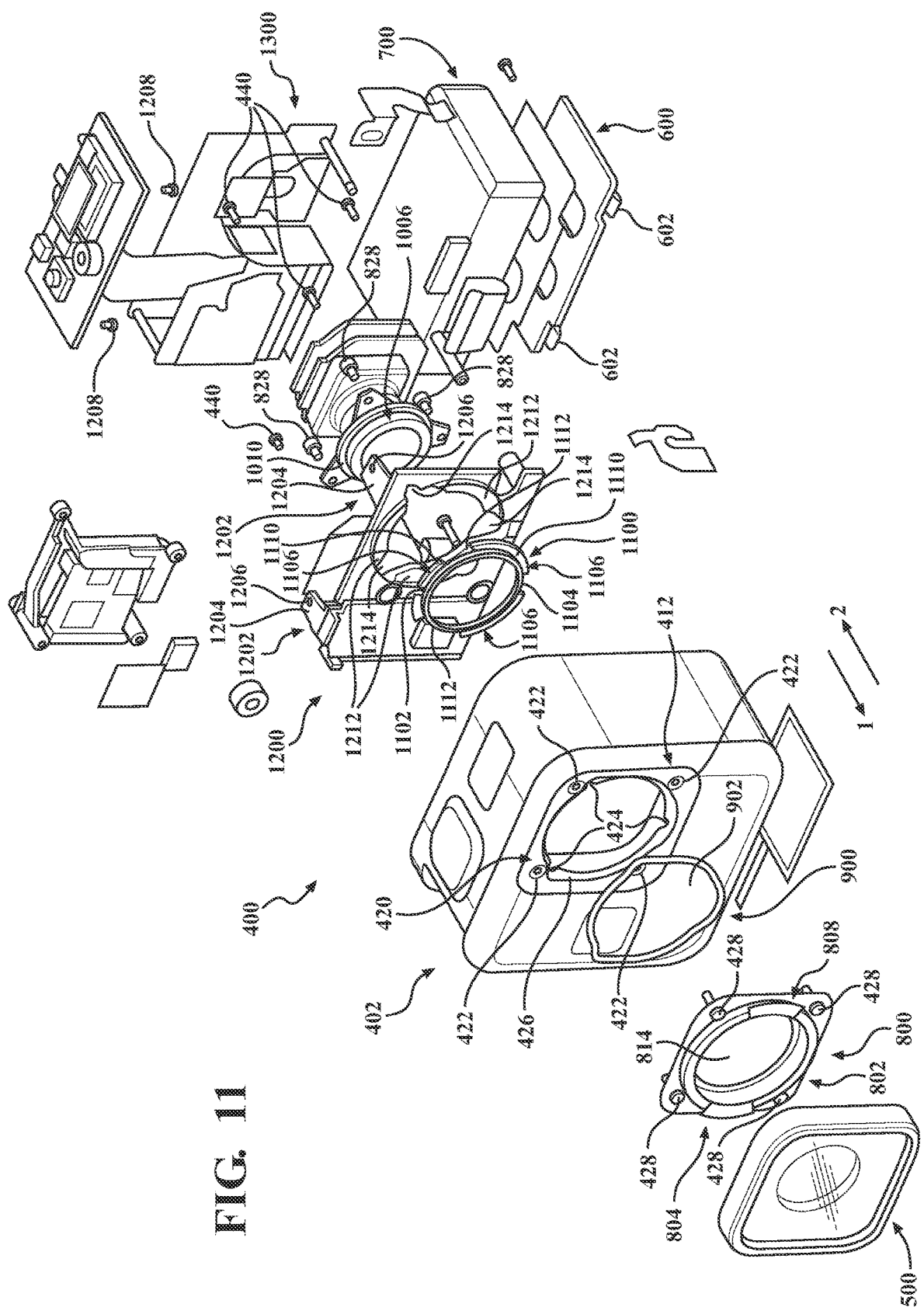
FIG. 11 is a front, perspective view of the image capture device seen in FIG. 4 with parts separated.
Figure 12:
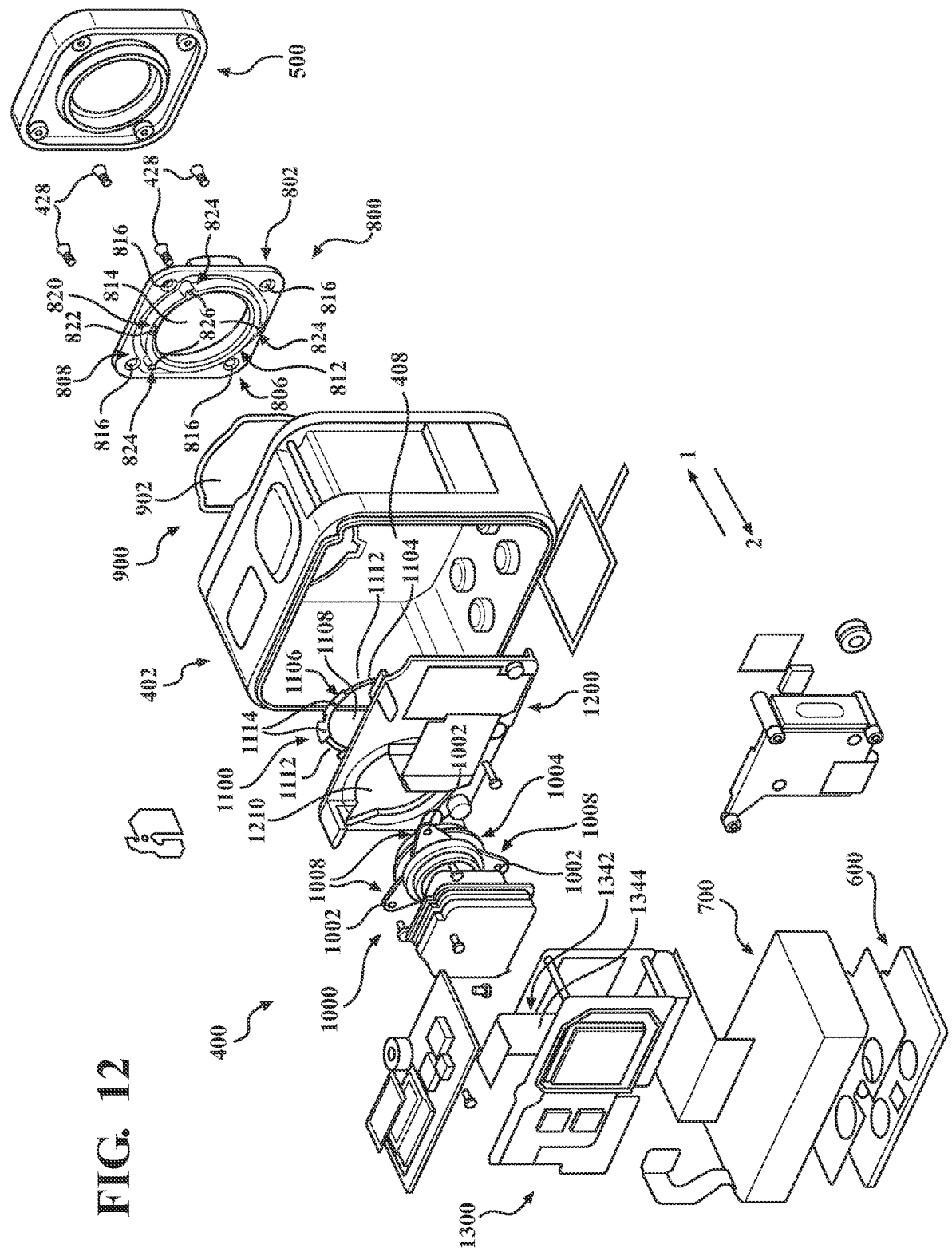
FIG. 12 is a rear, perspective view of the image capture device seen in FIG. 4 with parts separated.

More specifically, FIG. 4 provides a front, perspective view of the image capture device 400; FIG. 5 provides a rear, perspective view of the image capture device 400; FIG. 6 provides a rear, perspective view of the front housing portion 402; FIG. 7 provides a rear, perspective view of the rear housing portion 406; FIG. 8 provides a front, perspective view of the rear housing portion 406; FIG. 9 provides a rear, perspective view of the tray 600, the power source 700, and the PCB module 1300 upon assembly of the image capture device 400; FIG. 10 provides a rear, perspective view of the ISLA 1000 shown connected to the mounting member 800; FIG. 11 provides a front, perspective view of the image capture device 400 with parts separated; and FIG. 12 provides a rear, perspective view of the image capture device 400 with parts separated.

The front housing portion 402 (e.g., the bucket 404) includes an architecture that provides a framework for various components of the image capture device 400 including, for example, the tray 600, the power source 700, the mounting member 800, the ISLA 1000, the heatsink 1200, which itself provides a framework for various components, electronics, and circuitry that support operability and functionality of the image capture device 400, the PCB module 1300, and the chassis 1400. As described in detail below, the framework provided by the architecture of the front housing portion 402 simplifies assembly of the image capture device 400 by focusing the area where connections are to be made and reducing (if not entirely eliminating) blind steps, which improves visibility and facilitates more precise alignment of the components.

The front housing portion 402 defines an internal compartment 408 (FIG. 6) that receives (accommodates) the internal components of the image capture device 400 and includes a plurality (series) of apertures 410 (FIG. 4), which are configured to receive (accommodate) various buttons, displays, etc., and a window 412. In the particular embodiment illustrated, the front housing portion 402 includes: a (first) aperture 410*i* that is configured to receive a (first) button 414*i* (e.g., a shutter button); a (second) aperture 410*ii* that is configured to receive a (second) button 414*ii* (e.g., a mode button); a (third) aperture 410*iii* that is configured to receive a display 416; and a (fourth) aperture 410*iv* that is configured to receive a light pipe 418 (e.g., a status indicator or the like). It should be appreciated, however, that the particular number of apertures 410, buttons 414, displays 416, and light pipes 418 may be altered in various embodiments without departing from the scope of the present disclosure. As such, embodiments of the image capture device 400 including both greater and fewer numbers of apertures 410, buttons 414, displays 416, and light pipes 418 are also contemplated herein and would not be beyond the scope of the present disclosure.

The window 412 is configured to receive the mounting member 800, the sealing member 900, and the ISLA 1000 and is defined by a flange 420 (FIG. 11). The flange 420 is configured in correspondence with the mounting member 800 (e.g., such that the flange 420 and the mounting member 800 include configurations that mirror each other), whereby the mounting member 800 seats within the window 412, as described in further detail below. As seen in FIG. 11, the flange 420 includes: a plurality (series) of apertures 422; a plurality (series) of reliefs 424 (e.g., cutouts, notches, indentations, etc.); and a channel 426 that is configured to receive the sealing member 900.

The apertures 422 are configured to receive a plurality (series) of mechanical fasteners 428 (e.g., screws, pins, rivets, etc.) such that the mounting member 800 is directly connectable to the front housing portion 402 in either a fixed or removable fashion. Although shown as including four apertures 422 in the embodiment illustrated, it should be appreciated that the particular number of apertures 422 and, thus, the particular number of mechanical fasteners 428, may be varied without departing from the scope of the present disclosure (e.g., depending upon the particular configuration of the mounting member 800).

The reliefs 424 are configured to receive corresponding structures on the mounting member 800, as described in further detail below, such that the mounting member 800 is extendable through the window 412 and into the internal compartment 408. Although shown as including three reliefs 424 in the embodiment illustrated, it should be appreciated that the particular number of reliefs 424 may be varied without departing from the scope of the present disclosure (e.g., depending upon the particular configuration of the mounting member 800).

Extending around (e.g., adjacent to) its rear perimeter, the front housing portion 402 defines a planar shelf 430 (FIG. 6) and a tongue 432 that projects rearwardly (i.e., toward the rear housing portion 406). The planar shelf 430 defines a seat for the rear housing portion 406 to facilitate proper location (alignment) of the rear housing portion 406 relative to the front housing portion 402, which further enhances the overall fit and finish of the image capture device 400 upon assembly. As described in further detail below, the tongue 432 is configured to interface with a corresponding structure on the rear housing portion 406 to facilitate (sealed) engagement of the housing portions 402, 406 upon assembly of the image capture device 400.

The front housing portion 402 further includes at least one internal guide 434 (FIG. 6) that facilitates the insertion and connection of the various internal components of the image capture device 400. For example, in the particular embodiment illustrated, the front housing portion 402 includes a locating feature 436 that facilitates alignment of the WiFi antenna (not shown) as well as a plurality (series) of mounts 438 that are configured to support connection of the mounting member 800, the heatsink 1200, the tray 600, etc., to the front housing portion 402 and facilitate proper location thereof within the internal compartment 408. The internal guide(s) 436 (e.g., the locating feature 436 and the mounts 438) are oriented along a depth D of the image capture device 400, which facilitates insertion of the mounting member 800, the heatsink 1200, the tray 600, etc., in a forward (front) direction (e.g., towards the window 412), which is identified by arrow 1 (FIGS. 6, 11, 12).

In the particular embodiment illustrated, the front housing portion 402 includes: (first) mounts 438*i* that are configured to receive the mechanical fasteners 428 upon insertion through the apertures 422 in the flange 420; (second) mounts 438*ii* that are configured to receive a plurality (series) of mechanical fasteners 440 (FIG. 11) (e.g., screws, pins, rivets, etc.), which extend through the heatsink 1200 to thereby directly connect the heatsink 1200 to the front housing portion 402 in either a fixed or removable fashion; (third and fourth) mounts 438*iii*, 438*iv* that are configured to secure the tray 600 in relation to the housing portions 402, 406; and mounts 438*v* that are configured to receive a plurality (series) of mechanical fasteners 442 (FIG. 6) (e.g., screws, pins, rivets, etc.), which extend through the interconnect mechanism 136 (FIGS. 1B, 4, 9) such that the interconnect mechanism 136 is directly connected to the front housing portion 402 in either a fixed or removable fashion. Due to the mounting location and the configuration of the interconnect mechanism 136 and the image capture device 100, the interconnect mechanism 136 not only facilitates connection of the image capture device 100 to an accessory, as indicated above, but provides a base (e.g., a platform, a stand, etc.) in the extended (open) position.

To further facilitate assembly of the heatsink 1200 to the front housing portion 402, it is envisioned that the heatsink 1200 may include one or more structural supports 1202 (FIGS. 11, 12) (e.g., braces 1204) that are configured for connection to corresponding mounting locations within the internal compartment 408. For example, it is envisioned that each structural support 1202 may include one or more openings 1206 that are configured to receive a corresponding mechanical fastener 1208 (e.g., screws, pins, rivets, etc.) to thereby mechanically connect the heatsink 1200 to the front housing portion 402. Additionally, or alternatively, it is envisioned that the heatsink 1200 and the front housing portion 402 may be configured for connection (engagement) in an interference (press) fit arrangement, via an adhesive, or in any other suitable manner.

The rear housing portion 406 supports various thermal and electrical components of the image capture device 400 (e.g., circuitry and electronics supporting the operation and functionality thereof. For example, it is envisioned that the rear housing portion 406 may include one or more flexible printed circuits (FPCs), electrical connectors, one or more conductive elements to facilitate grounding of the rear housing portion 406, etc.

The rear housing portion 406 includes an additional, independent (second, rear) heatsink 444 (FIG. 7), which is formed as a separate component of the image capture device 400 that is discrete from the heatsink 1200. The incorporation of heatsink functionality into the rear housing portion 406 obviates the need for a separate heatsink that may otherwise be connected to the rear housing portion 406, which simplifies assembly and construction of the image capture device 400 and contributes to a reduction in the overall form factor.

To facilitate the conduction of heat (e.g., away from the ISLA 1000, the PCB module 1300, etc.), the rear housing portion 406 may include (e.g., may be formed partially or entirely from) any suitable material (e.g., aluminum) or combination of materials and may be thermally connected to one or more components of the image capture device 400 (e.g., to the image sensor(s) 312 (FIGS. 3, 10), the aforementioned image processor, the PCB module 1300, etc.). It is envisioned that such thermal connections may be established in any suitable manner, such as, for example, by one or more graphite conductors. Integrating the heatsink 444 into the rear housing portion 406 allows for the elimination of any structural connection therebetween, thereby reducing the number of fasteners and connections required so as to simplify assembly of the image capture device 400.

Extending around its perimeter, the rear housing portion 406 defines a recess (groove) 446 (FIG. 8) that is configured in correspondence with the tongue 432 (FIG. 6) extending form the front housing portion 402. The recess 446 is configured to receive the tongue 432 such that the housing portions 402, 406 are connectable in a tongue-and-groove fashion. To enhance the connection between the housing portions 402, 406 and further facilitate the formation of a watertight seal therebetween, it is envisioned that an adhesive 448 may be applied to the tongue 432 and/or the recess 446 prior to connection of the housing portions 402, 406.

With reference now to FIGS. 13 and 14 as well, the tray 600 will be discussed. More specifically, FIG. 13 provides a vertical, cross-sectional view of the front housing portion 402 and the tray 600 upon installation, and FIG. 14 provides a vertical, cross-sectional view of the rear housing portion 406 and the tray 600 upon installation. The tray 600 supports the power source 700 and includes: one or more (front, first) flanges 602 (FIG. 11); one or more (rear, second) flanges 604; an opening 606; and a plurality (series) of through-bores 608 (or other such openings). As described in further detail below, the tray 600 extends between (and engages) the housing portions 402, 406 such that the tray 600 is secured therebetween.

The flange(s) 602 interface with (connect to, extend into engagement with) the front housing portion 402. More specifically, the flange(s) 602 are configured for insertion into the mounts 438*iii*, which include receptacles 450 that extend (vertically) upward from a base wall 452 of the front housing portion 402 within the internal compartment 408 and are recessed vertically into the tray 600 so as to define a tab 610 that is positioned between the receptacles 450.

In the particular embodiment illustrated, the tray 600 include a pair of flanges 602 and the front housing portion 402 includes a pair of mounts 438*ii* (e.g., a pair of receptacles 450). It should be appreciated, however, that the particular number of flanges 602 and mounts 438*ii* may be altered in various embodiments without departing from the scope of the present disclosure. As such, embodiments of the image capture device 400 including both greater and fewer numbers of flanges 602 and mounts 438*ii* are also contemplated herein and would not be beyond the scope of the present disclosure.

The flanges 604 interface with (connect to, extend into engagement with) the rear housing portion 406. More specifically, the flanges 604 are configured for engagement (contact) with corresponding tabs 454 (FIG. 8) that extend (project) from the rear housing portion 406 towards the front housing portion 402. As seen in FIGS. 8 and 14, each of the tabs 454 defines a chamfered (beveled) surface 456 that is configured for engagement with a corresponding chamfered (beveled) surface 612 defined by each of the flanges 604 so as to guide and secure the flanges 604 beneath the tabs 454 during assembly of the housing portions 402, 406.

In the particular embodiment illustrated, the tray 600 includes a pair of flanges 604 and the rear housing portion 406 includes four tabs 454. It should be appreciated, however, that the particular number of flanges 604 and tabs 454 may be altered in various embodiments without departing from the scope of the present disclosure. As such, embodiments of the image capture device 400 including both greater and fewer numbers of flanges 604 and tabs 454 are also contemplated herein and would not be beyond the scope of the present disclosure.

The opening 606 in the tray 600 is configured to receive a mechanical fastener 614 (e.g., a screw, pin, rivet, etc.) such that the mechanical fastener 614 extends through the tray 600 and into an opening 458 defined by the mount 438*iv* to further secure the tray 600 in relation to the front housing portion 402.

The through-bores 608 extend through the tray 600 and are configured to receive the mounts 438*v*, which extend inwardly from the front housing portion 402 and into the internal compartment 408. As seen in FIG. 13, upon assembly of the image capture device 400, the mounts 438*v* extend into the through-bores 608, which further contributes to reductions in the overall form factor of the image capture device 400.

The mounting member 800 is connected (secured) to the front housing portion 402 adjacent to the window 412 (FIGS. 4, 11) defined by the flange 420 and supports the cover 500 and the ISLA 1000, each of which is configured for direct connection to the mounting member 800, as discussed in further detail below. By directly connecting the ISLA 1000 to the mounting member 800, physical, supportive connections between the ISLA 1000 and the heatsink 1200 can be reduced (if not entirely eliminated) so as to further simplify assembly of the image capture device 400. The configuration of the mounting member 800 also eliminates any direct physical connection between the cover 500 and the heatsink 1200, which also simplifies sealing of the image capture device 400. More specifically, as described in further detail below, by sealing the mounting member 800 to the front housing portion 402 (via the sealing member 900) and the ISLA 1000 (via the sealing member 1100), sealing can be localized to the mounting member 800, which allows the overall geometry and architecture of the image capture device 400 to be simplified by eliminating the need for a perimeter seal about the heatsink 1200. Moreover, the seals established between the mounting member 800, the front housing portion 402, and the ISLA 1000 by the sealing members 900, 1100 allow the image capture device 400 to remain watertight upon removal of the cover 500.

The mounting member 800 includes respective (front, first and rear, second) end portions 804, 806 that are separated (delineated) by a (generally planar) base 808. The end portions 804, 806 respectively include (front, first and rear, second) collars 810, 812 (FIGS. 11, 12) that extend from the base 808 in opposing (forward and rearward) directions. The base 808 is configured in correspondence with the flange 420 of the front housing portion 402 such that the base 808 seats within the window 412, whereby, upon assembly of the image capture device 400, the end portion 804 (e.g., the collar 810) extends (is positioned) externally of the image capture device 400 and the end portion 806 (e.g., the collar 812) extends into (is positioned internally within) the image capture device 400 (e.g., within the internal compartment 408). The base 808 includes a (central) opening 814 that is configured to receive the ISLA 1000 and a plurality (series) of apertures 816 that extend therethrough. The apertures 816 are positioned in alignment (registration) with the apertures 422 (FIG. 11) formed in the flange 420 and are configured to receive the mechanical fasteners 428 to thereby connect the mounting member 800 to the front housing portion 402.

The collar 810 (FIG. 11) of the mounting member 800 is generally annular in configuration and extends outwardly from the base 808 in the forward direction 1. The collar 810 includes a pair of ears 818 that are formed integrally (e.g., unitarily, monolithically) therewith and which extend radially (laterally) outward therefrom. The ears 818 are configured for releasable engagement with the cover 500 such that the cover 500 is (repeatably) connectable to and disconnectable from the image capture device 400 via the mounting member 800. While the collar 810 is illustrated as including a pair of diametrically opposed ears 818 in the illustrated embodiment, it should be appreciated that the particular number, location, and/or configuration of ears 818 may be varied in alternate embodiments without departing from the scope of the present disclosure (e.g., depending upon the particular configuration of the cover 500).

The collar 812 (FIG. 12) is generally annular in configuration and extends outwardly from the base 808 in a rearward direction (e.g., toward the rear housing portion 406), which is identified by the arrow 2 (FIGS. 6, 11, 12). The collar 812 is spaced radially (laterally) inward from the apertures 816 extending through the base 808. The collar 812 is configured for insertion into (through) the window 412 to further recess the mounting member 800 within the front housing portion 402, thereby reducing the overall spatial requirements of the mounting member 800 and further contributing to reductions in the overall form factor of the image capture device 400.

The collar 812 includes an integral locating feature 820 (e.g., a detent 822 or other such projection) that is configured for receipt within a corresponding notch 1102 (FIG. 11) defined by the sealing member 1100 to facilitate proper relative orientation of the mounting member 800 and the sealing member 1100. Although shown as including a single locating feature 820 in the illustrated embodiment, it should be appreciated that the particular number and/or location of the locating feature(s) 820 may varied without departing from the scope of the present disclosure (e.g., depending upon the particular configuration of the sealing member 1100).

The collar 812 further includes a plurality (series) of eyelets 824 (FIG. 12) extending radially (laterally) outward therefrom that are configured for reception within the reliefs 424 defined by the flange 420, which facilitates proper orientation of the mounting member 800 and the front housing portion 402 and inhibits (if not entirely prevents) relative rotation therebetween. Each eyelet 824 defines an aperture 826 that extends partially through the mounting member 800. The eyelets 824 and the apertures 826 are positioned in alignment (registration) with corresponding apertures 1002 (FIG. 12) in the ISLA 1000 such that the ISLA 1000 is directly connectable to the mounting member 800 via a plurality (series) of mechanical fasteners 828 (FIG. 11) (e.g., screws, pins, rivets, etc.) in either a fixed or removable fashion. Although shown as including three eyelets 824 and three apertures 826 that are spaced (approximately) equidistant from each other in the particular embodiment illustrated (e.g., such that the apertures 826 are separated by approximately 120°), it should be appreciated that the particular number and/or location of the eyelets 824 and the apertures 826 may varied without departing from the scope of the present disclosure (e.g., depending upon the particular configuration of the ISLA 1000).

The sealing member 900 (FIGS. 11, 12) is located between the mounting member 800 and the front housing portion 402. More specifically, the sealing member 900 is positioned about the collar 812 of the mounting member 800 within the channel 426 (FIG. 11) defined by the flange 420 such that the sealing member 900 is positioned between the apertures 816 in the base 808 and the eyelets 824, which are received by the reliefs 424 such that the eyelets 824 extend into the channel 426. More specifically, the sealing member 900 is positioned radially (laterally) inward of the apertures 816 and laterally outward of the eyelets 824. To facilitate such location, in certain embodiments, such as that illustrated, the sealing member 900 may include a (first) non-annular configuration that may be characterized as generally escutcheon or shield-shaped. Alternative configurations for the sealing member 900, however, would not be beyond the scope of the present disclosure. For example, an embodiment of the sealing member 900 including a generally annular configuration is also contemplated herein. Additionally, while the sealing member 900 is illustrated as including a generally circular (annular) cross-sectional configuration, it should be appreciated that the particular cross-sectional configuration of the sealing member 900 may be varied in alternate embodiments without departing from the scope of the present disclosure. For example, it is envisioned that the sealing member 900 may instead include a (generally) elliptical or polygonal cross-sectional configuration.

The sealing member 900 defines a (central) opening 902 that is configured to receive the collar 812 of the mounting member 800 and the ISLA 1000. The sealing member 900 is configured to form a watertight seal between the mounting member 800 and the front housing portion 402 and may include (e.g., may be formed partially or entirely from) any material or combination of materials suitable for this intended purpose. For example, in the illustrated embodiment, the sealing member 900 includes (e.g., is formed partially or entirely from) silicone. It should be appreciated, however, that the use of alternative material(s) of construction would not be beyond the scope of the present disclosure.

With particular reference to FIGS. 10-12, the ISLA 1000 will be discussed. The ISLA 1000 receives and focuses light and converts captured content into an electronic image signal that is processed to form an image. The ISLA 1000 includes a body 1004 supporting one or more image sensors (e.g., the image sensor(s) 312 (FIG. 3) and one or more lenses (e.g., the lens(es) 104), which receive and direct light onto the image sensor(s) 312.

The ISLA 1000 extends through an opening 1210 (FIG. 12) in the heatsink 1200, which allows for direct connection (securement) of the ISLA 1000 to the mounting member 800 (e.g., the rear end portion 806) in the forward direction 1 from within the image capture device 400 (e.g., from within the internal compartment 408), whereby the ISLA 1000 is operatively (indirectly) connected to the front housing portion 402 via the mounting member 800. Upon assembly of the image capture device 400, the ISLA 1000 (e.g., the lens 104) extends through the window 412 defined by the flange 420 of the front housing portion 402, as seen in FIG. 4. To facilitate such connection, the ISLA 1000 includes a collar 1006 supporting a plurality (series) of wings 1008 that extend radially outward therefrom, which include the aforedescribed apertures 1002. The collar 1006 is concentrically positioned so as to define a (generally annular) shoulder 1010 that supports the sealing member 1100. Upon assembly of the image capture device 400, the mechanical fasteners 828 are inserted through the apertures 1002 in the wings 1008 (in the forward direction 1) and into the apertures 826 (FIG. 12) in the eyelets 824 on the collar 812 of the mounting member 800, thereby directly securing together the ISLA 1000 and the mounting member 800.

Although shown as including three wings 1008 that are spaced (approximately) equidistant from each other in the particular embodiment illustrated (e.g., such that the wings 1008 are separated by approximately 120°), it should be appreciated that the particular number and/or location of the wings 1008 may varied without departing from the scope of the present disclosure (e.g., depending upon spatial requirements, the particular configurations of the ISLA 1000 and the heatsink 1200, etc.).

In certain embodiments, such as that illustrated throughout the figures, it is envisioned that the heatsink 1200 may include one or more recesses 1212 (FIG. 11) that are configured in correspondence with the sealing member 1100 (as described in further detail below) and a plurality (series) of reliefs 1214 (e.g., cutouts, notches, indentations, etc.) that are configured in correspondence with the wings 1008 of the ISLA 1000. As such, in the illustrated embodiment, the heatsink 1200 includes three reliefs 1214 that are spaced (approximately) equidistant from each other (e.g., such that the reliefs 1214 are separated by approximately) 120°. It should be appreciated, however, that the particular number and/or location of the reliefs 1214 may be varied without departing from the scope of the present disclosure (e.g., depending upon the particular number and/or location of the wings 1008 included on the ISLA 1000).

Upon assembly of the image capture device 400, the ISLA 1000 extends through the opening 1210 and the wings 1008 extend through the reliefs 1214, which not only facilitates proper alignment (registration) of the ISLA 1000 and the heatsink 1200, but reduces the overall spatial requirements of the heatsink 1200 and the ISLA 1000, thereby further contributing to reductions in the overall form factor of the image capture device 400.

By directly connecting the ISLA 1000 to the mounting member 800, physical, supportive connections between the ISLA 1000 and the heatsink 1200 can be reduced, thereby simplifying assembly of the image capture device 400. More specifically, the architecture of the front housing portion 402 (e.g., the bucket 404) described herein allows for a complete elimination of any physical connection between the ISLA 1000 and the heatsink 1200. Additionally, connection of the ISLA 1000 directly to the mounting member 800, rather than via an intermediate component (such as the heatsink 1200, for example), enables precise alignment of the ISLA 1000 and the mounting member 800, which, thus, enables precise alignment of the cover 500, the mounting member 800, and the ISLA 1000. By increasing precision in the alignment of the cover 500 and the ISLA 1000 (via positioning of the mounting member 800 located therebetween), basic functionality of the image capture device 400 can be improved. Moreover, direct connection of the ISLA 1000 to the mounting member 800 increases precision in the relative alignment of the ISLA 1000 and the front housing portion 402, which not only simplifies assembly of the image capture device 400 by reducing the number of alignments that must occur, but enhances the overall fit and finish of the image capture device 400.

The sealing member 1100 is located between the mounting member 800 and the ISLA 1000. More specifically, the sealing member 1100 is positioned about the ISLA 1000 such that the sealing member 1100 is supported by the shoulder 1010 (FIG. 11) defined by the collar 1006. The sealing member 1100 forms watertight seals with both the mounting member 800 and the ISLA 1000 upon assembly of the image capture device 400, thereby obviating any need to form a direct seal between the ISLA 1000 and the front housing portion 402, and may include any material(s) suitable for this intended purpose. For example, in the particular embodiment illustrated throughout the figures, the sealing member 1100 includes (e.g., is formed partially or entirely from) conductive silicone, which facilitates grounding of the heatsink 1200 relative to the mounting member 800 (via the sealing member 1100). It should be appreciated, however, that the use of alternative material(s) of construction would not be beyond the scope of the present disclosure.

The sealing member 1100 includes a (second, generally annular) configuration that differs from that of the sealing member 900. More specifically, the sealing member 1100 includes a rib 1104 and a plurality (series) of feet 1106 that extend radially outward from the rib 1104. The rib 1104 is (generally) annular in configuration and defines a (central) opening 1108 for receipt of the ISLA 1000, an inner transverse cross-sectional dimension (e.g., an inner diameter) that exceeds an outer transverse cross-sectional dimension (e.g., an outer diameter) defined by the collar 1006 of the ISLA 1000 and an outer transverse cross-sectional dimension (e.g., an outer diameter) that is less than an inner transverse cross-sectional dimension (e.g., an inner diameter) defined by the collar 812 of the mounting member 800, which allows the rib 1104 to be positioned concentrically about the collar 1006 and concentrically within the collar 812 upon assembly of the image capture device 400. The relative dimensioning between the collar 1006, the rib 1104, and the collar 812 allows the sealing member 1100 to simultaneously contact (engage), and thereby form watertight seals with, the ISLA 1000 and the mounting member 800, thus, sealing together the ISLA 1000, the mounting member 800, and the front housing portion 402. More specifically, the sealing member 1100 seals with the ISLA 1000 at the interface of the rib 1104 and the collar 1006 and with the mounting member 800 at the interfaces between the collar 812, the rib 1104, and outer (front, forward) surfaces 1110 (FIG. 11) of the feet 1106.

The feet 1106 are configured for reception by and seating within the recesses 1212 defined by the heatsink 1200 and are circumferentially spaced from each other so as to define windows 1112 therebetween. The windows 1112 are positioned in alignment (registration) with the wings 1008 extending from the collar 1006 of the ISLA 1000 such that the wings 1008 and, thus, the mechanical fasteners 828, are received by (and extend through) the windows 1112 upon assembly of the image capture device 400. While the illustrated embodiment of the sealing member 1100 is shown as including three feet 1106 that are spaced (approximately) equidistant from each other (e.g., such that centerpoints thereof are separated by approximately 120°) and three windows 1112 that are spaced (approximately) equidistant from each other (e.g., such that centerpoints thereof are separated by approximately 120°), it should be appreciated that the specific number, location, and/or configuration of the feet 1106 and/or the windows 1112 may be varied without departing from the scope of the present disclosure (e.g., depending upon the particular configuration of the ISLA 1000).

In certain embodiments, such as that illustrated, it is envisioned that the sealing member 1100 may include one or more contacts 1114 (FIGS. 10, 12) to facilitate grounding of the heatsink 1200 relative to the mounting member 800. Although shown as being positioned on rear surfaces 1116 (FIG. 10) of the feet 1106, it should be appreciated that the particular location of the contact(s) 1114 may be varied in alternate embodiments without departing from the scope of the present disclosure.

As indicated above, the locating feature 820 (FIG. 12) extending from the collar 812 of the mounting member 800 is configured for insertion into the aforementioned notch 1102, which is provided in (defined by) one of the feet 1106 on the sealing member 1100, to facilitate proper relative orientation of the mounting member 800 and the sealing member 1100. Although shown as including a single notch 1102 in the illustrated embodiment, it should be appreciated that the particular number and/or location of the notch(es) 1102 may varied without departing from the scope of the present disclosure (e.g., depending upon the particular configuration of the mounting member 800). For example, it is envisioned that each foot 1106 may define a notch 1102 that is configured to receive a corresponding locating feature 820 extending from the collar 812.

With reference now to FIGS. 4, 11, and 12, the cover 500 will be discussed. The cover 500 functions as a removable cap that protects and conceals the ISLA 1000. Although shown as being generally square-shaped in configuration throughout the figures, it should be appreciated that the specific configuration of the cover 500 may be varied in alternate embodiments without departing from the scope of the present disclosure (e.g., depending upon the particular configuration of the ISLA 1000 and/or the front housing portion 402, the desired aesthetic appearance of the image capture device 400, etc.).

The cover 500 and the mounting member 800 are configured for direct, releasable connection. More specifically, the cover 500 is configured for removable connection to the front end portion 804 of the mounting member 800 via the ears 818, which facilitates (repeated) connection and disconnection of the cover 500, as indicated above. For example, the cover 500 may include one or more pockets (or other such recesses or openings) that are configured in correspondence with the ears 818. To facilitate connection and disconnection of the cover 500, it is envisioned that the ears 818 may include (or otherwise define) angled (e.g., chamfered) bearing surfaces 830 (FIG. 4) that are configured to urge the cover 500 outwardly (away from the front housing portion 402) upon rotation of the cover 500.

Directly connecting the cover 500 to the mounting member 800 allows for the elimination of any interposed components (e.g., the heatsink 1200) between the cover 500, the mounting member 800, and the front housing portion 402. The elimination of interposed components between the cover 500, the mounting member 800, and the front housing portion 402 reduces the number of components that must be properly aligned during assembly of the image capture device 400, which not only simplifies the assembly process, but improves the overall alignment of the cover 500 relative to the front housing portion 402 and the ISLA 1000, thereby enhancing the overall fit and finish of the image capture device 400.

Figure 15:
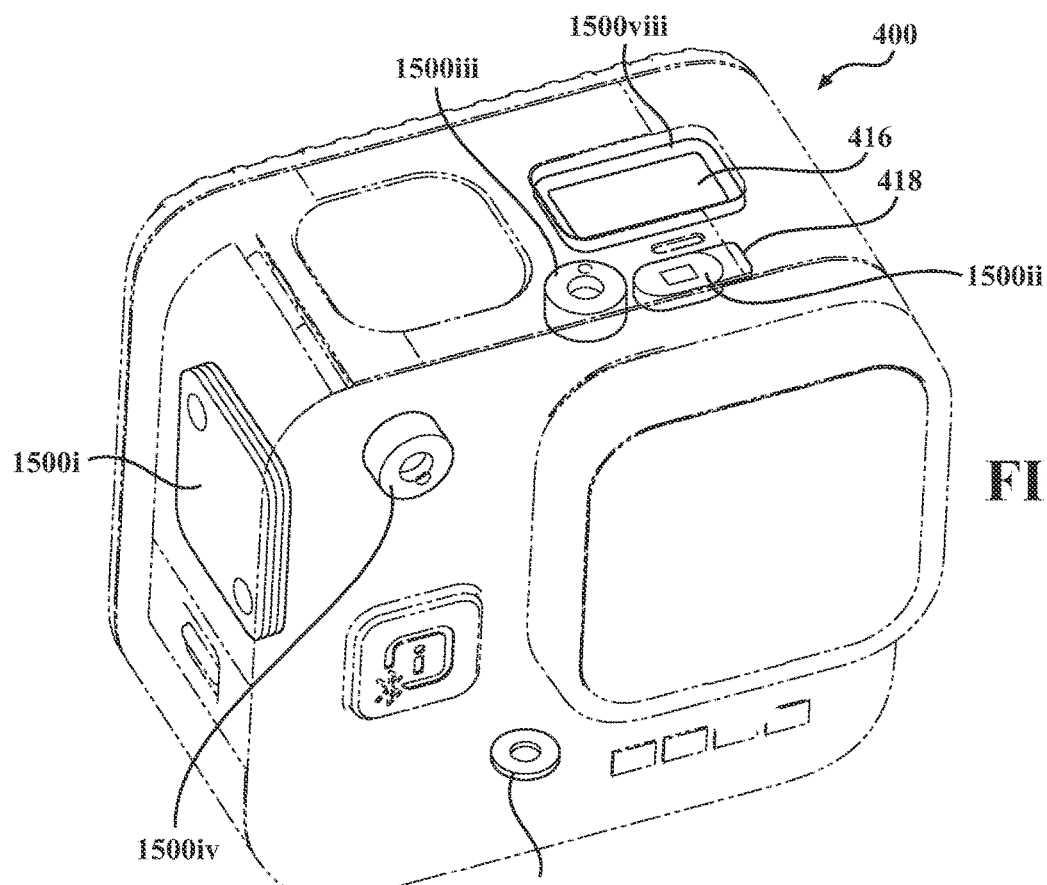
FIGS. 15 and 16 are respective front and rear perspective views of the image capture device seen in FIG. 4 illustrating a variety of sealing members.
Figure 16:
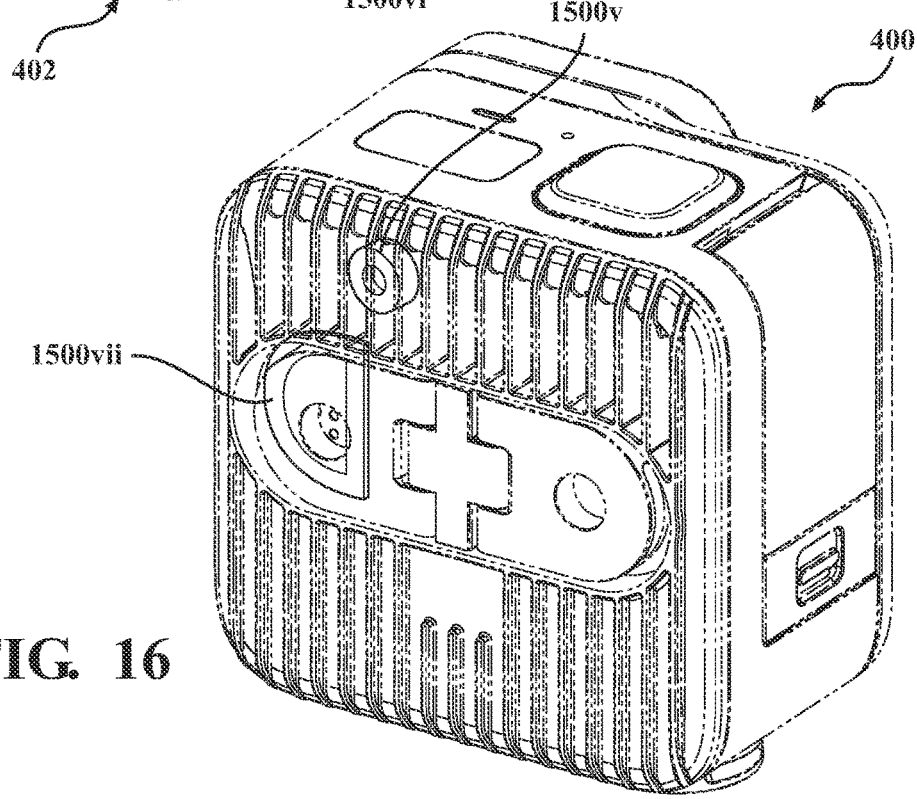

To further enhance sealing of the image capture device 400, it is envisioned that the image capture device 400 may include a variety of supplemental sealing members 1500, which may include (e.g., may be formed from) any suitable material or combination of materials, such as a foam, silicone, one or more polymeric materials, a pressure-sensitive adhesive, a heat-activated film, etc. For example, FIGS. 15 and 16 provide front and rear perspective views of the image capture device 400, respectively, and illustrate a sealing member 1500i that is configured to form a watertight seal between the front housing portion 402 and the door 114 (FIG. 1A); a sealing member 1500ii that is configured to form a watertight seal about the light pipe 418; a sealing member 1500iii that is configured to form a watertight seal about the one or more upper (top) microphones; a sealing member 1500iv that is configured to form a watertight seal about one or more front microphones; a sealing member 1500v that is configured to form a watertight seal about one or more rear microphones; a sealing member 1500vi that is configured to form a watertight seal about one or more vents that allow for pressure equalization with the external environment by allowing air to pass therethrough; a sealing member 1500vii that is configured to form a watertight seal about one or more speakers; and a sealing member 1500viii that is configured to form a watertight seal about the display 416.

Figure 17:
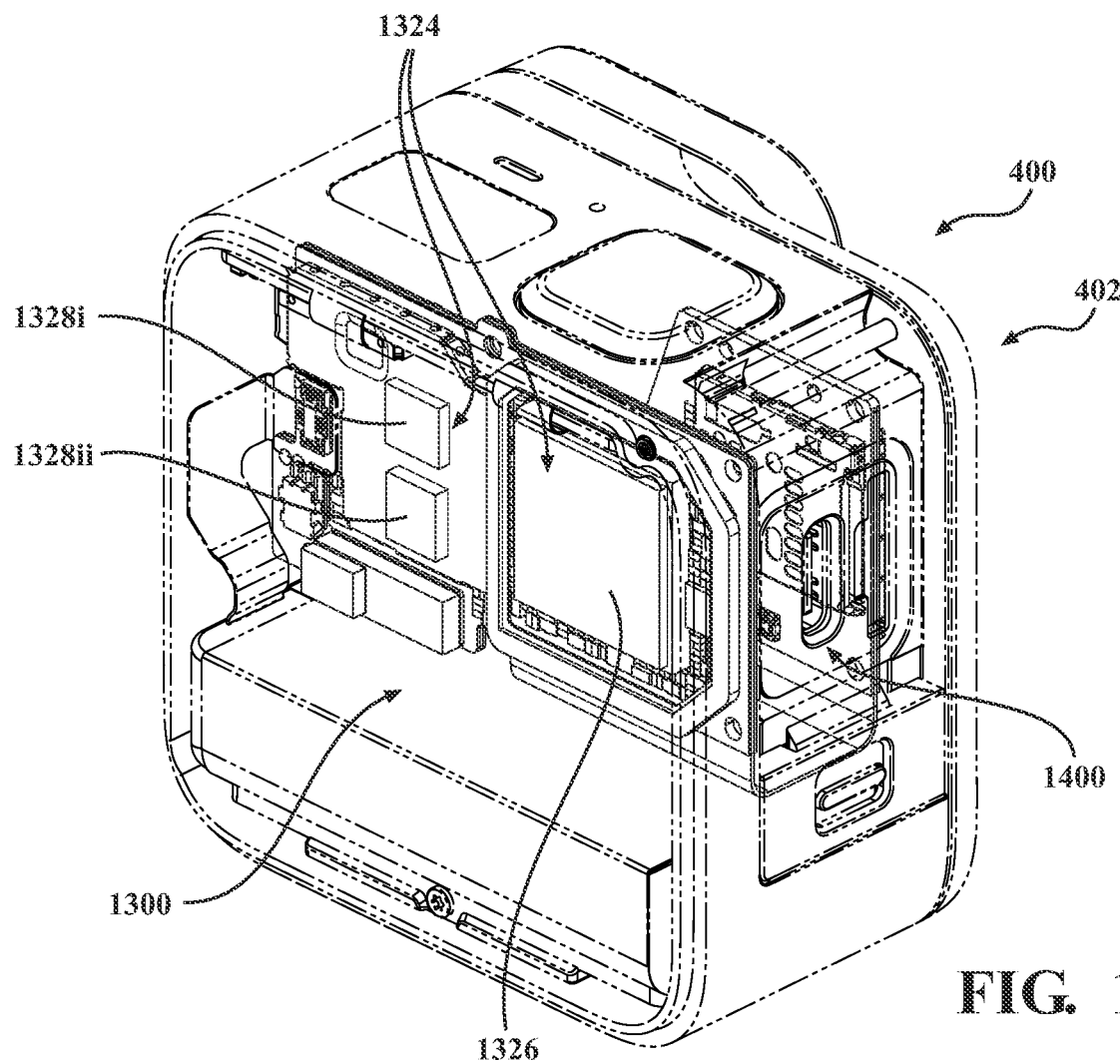
FIG. 17 is a rear, perspective view of the image capture device seen in FIG. 4 with the rear housing portion removed and illustrating the PCB module shown with a chassis.
Figure 18:
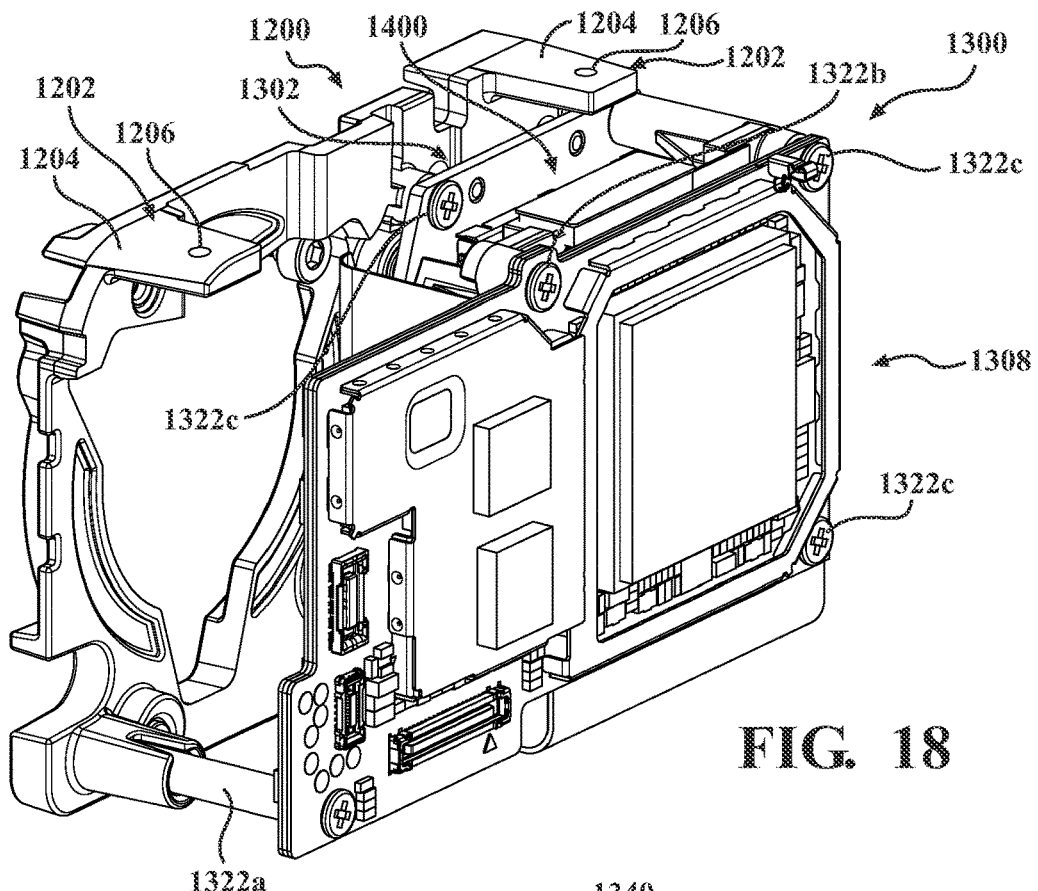
FIGS. 18 and 19 are rear, perspective views of the PCB module and the chassis seen in FIG. 17 shown connected to a heatsink.
Figure 19:
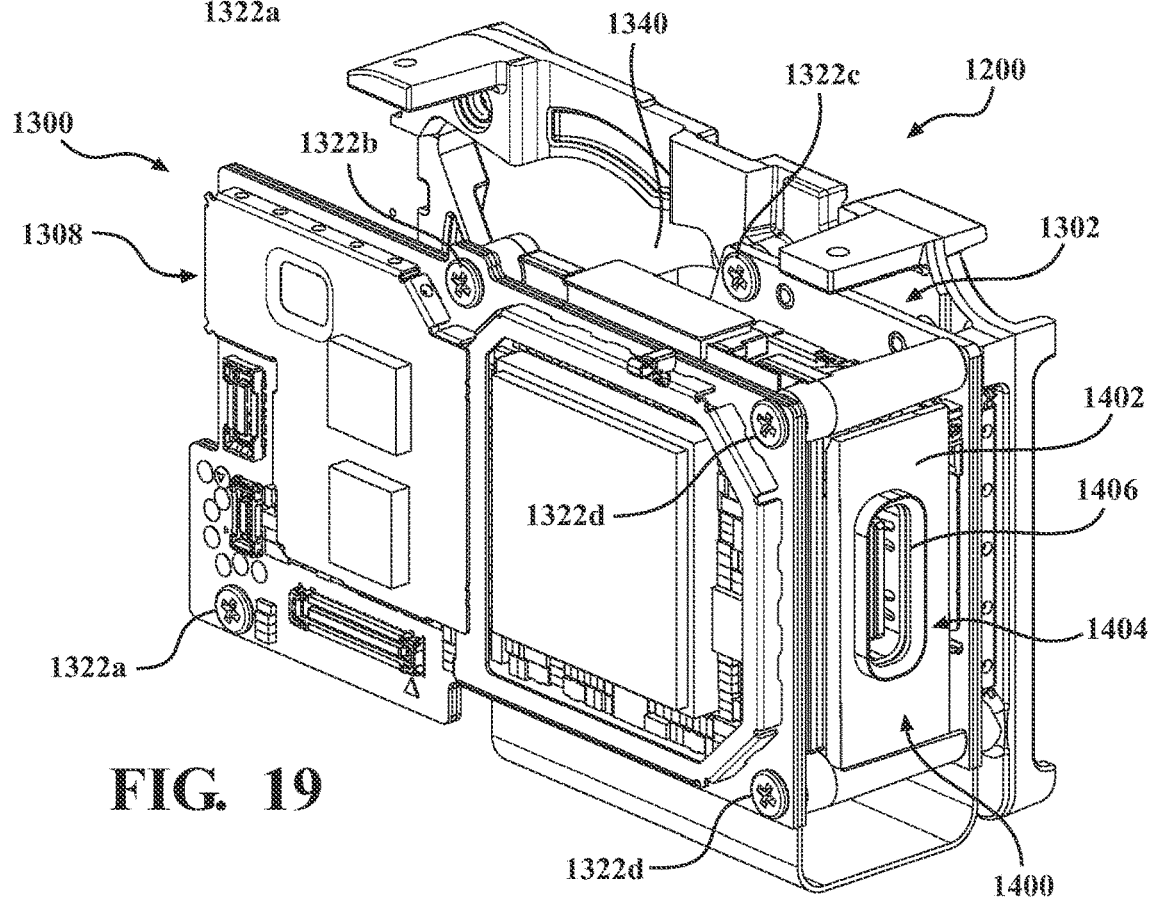
Figure 20:
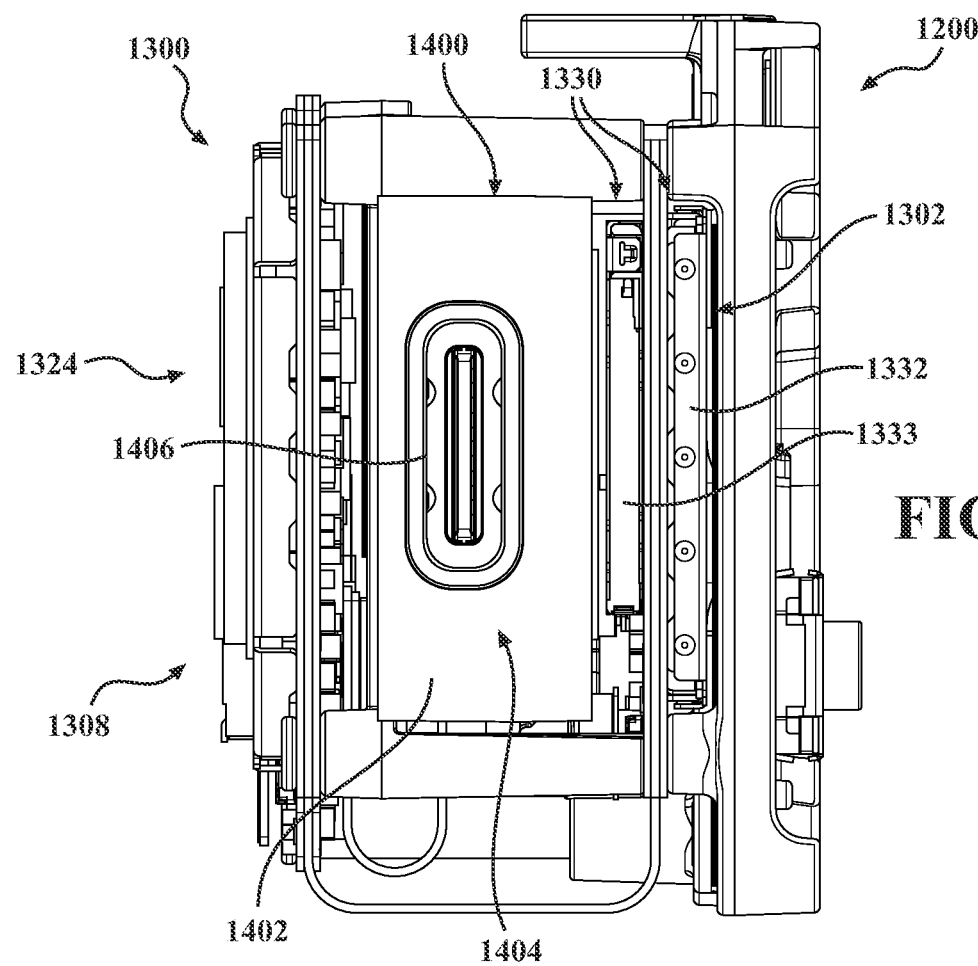
FIG. 20 is a side, plan view of the PCB module, the chassis, and the heatsink seen in FIGS. 18 and 19.
Figure 21:
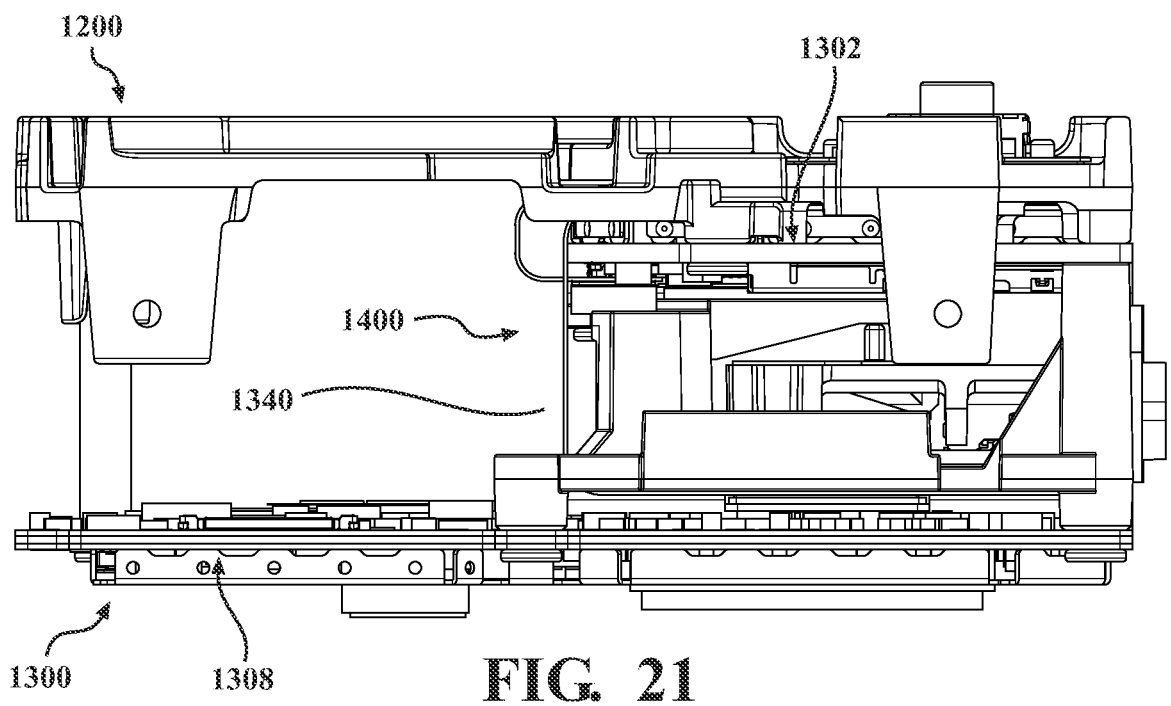
FIG. 21 is a top, plan view of the PCB module, the chassis, and the heatsink seen in FIGS. 18-20.
Figure 22:
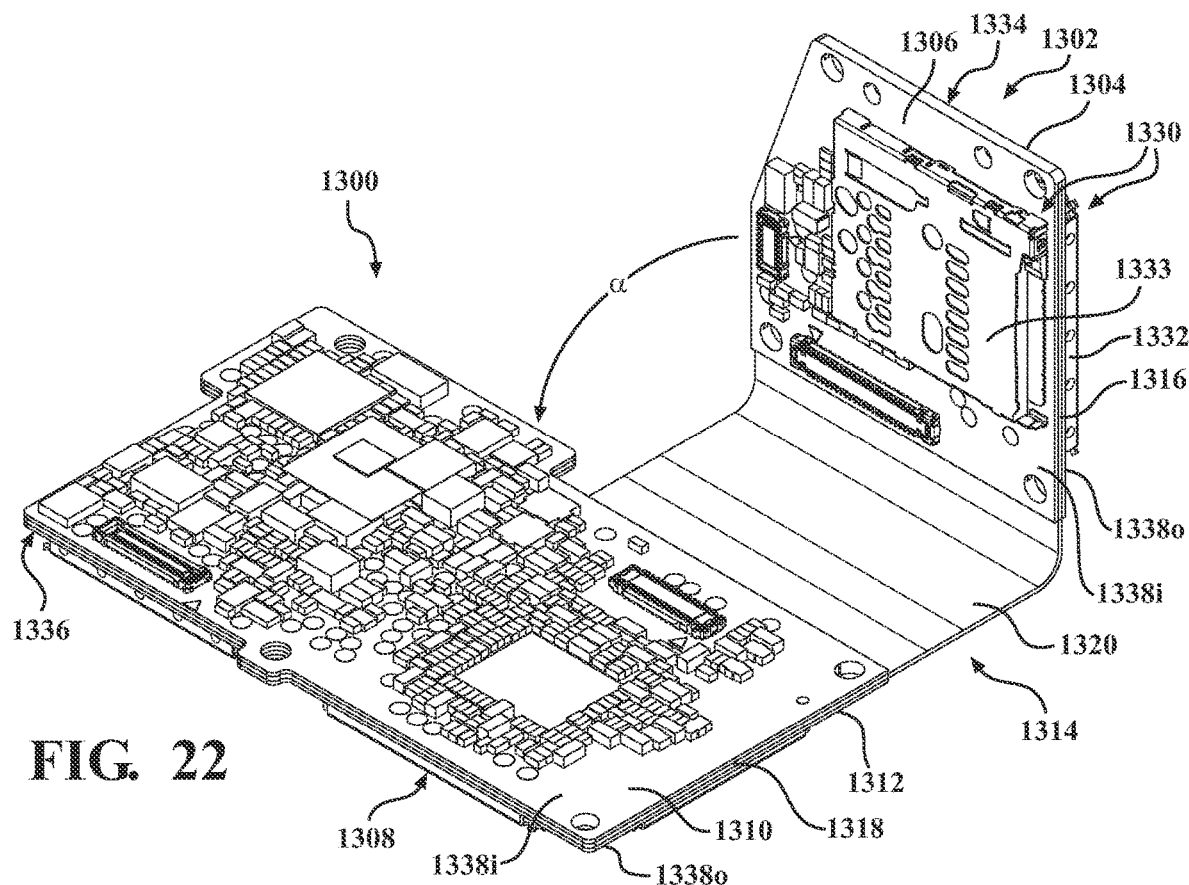
FIG. 22 is a rear, perspective view of the PCB module shown in a first configuration.
Figure 23:
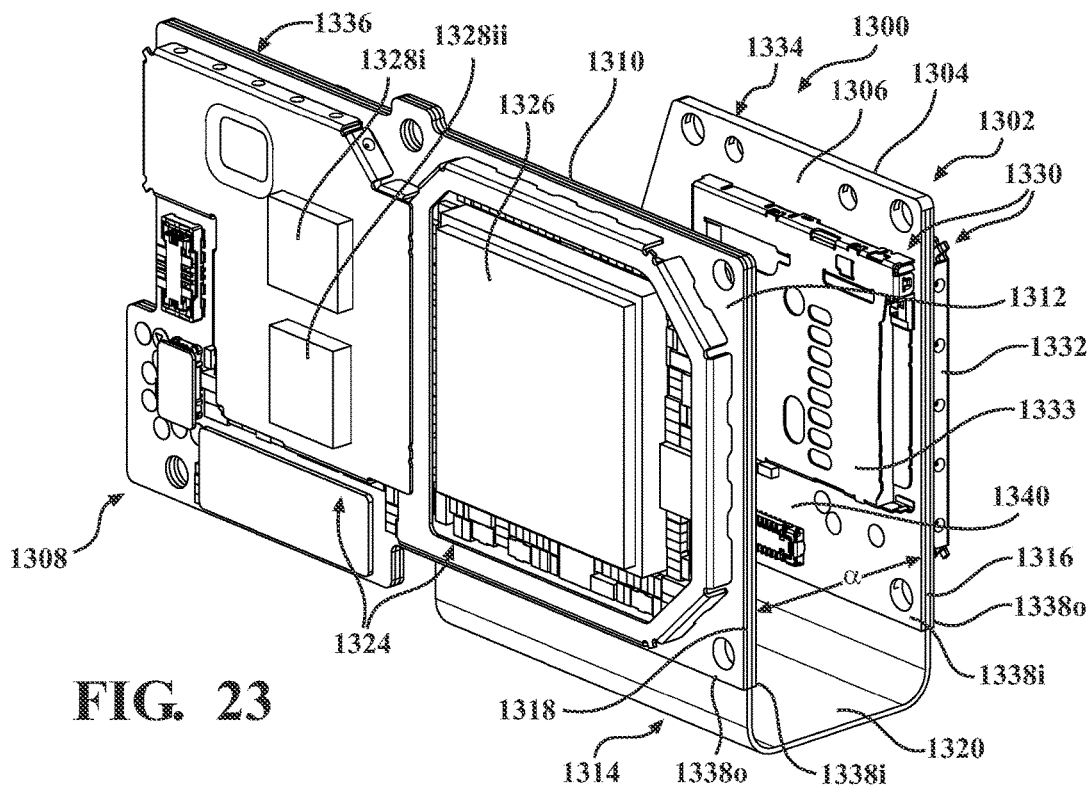
FIG. 23 is a rear, perspective view of the PCB module shown in a second configuration.

With reference now to FIGS. 17-23, the PCB module 1300 and the chassis 1400 will be discussed. More specifically, FIG. 17 provides a rear, perspective view of the PCB module 1300 and the chassis 1400 upon assembly of the image capture device 400; FIGS. 18 and 19 provide rear, perspective views of the PCB module 1300 and the chassis 1400 shown removed from the image capture device 400 and connected to the heatsink 1200; FIG. 20 provides a side, plan view of the PCB module 1300 and the chassis 1400 shown removed from the image capture device 400 and connected to the heatsink 1200; FIG. 21 provides a top, plan view of the PCB module 1300 and the chassis 1400 shown removed from the image capture device 400 and connected to the heatsink 1200; FIG. 22 provides a rear, perspective view of the PCB module 1300 shown in a first configuration; and FIG. 23 provides a rear, perspective view of the PCB module 1300 shown in a second configuration.

The PCB module 1300 includes: a front (first) PCB assembly 1302, which defines respective front and rear faces 1304, 1306 (FIGS. 22, 23); a rear (second) PCB assembly 1308, which defines respective front and rear faces 1310, 1312 (FIGS. 22, 23); and a connector 1314, which extends between the PCB assemblies 1302, 1308 and includes opposing (first and second) end portions 1316, 1318 (FIGS. 22, 23) that are connected by a body portion 1320. The PCB module 1300 is connected to the heatsink 1200 and the chassis 1400 via a plurality (series) of mechanical fasteners 1322 (e.g., screws, pins, rivets, etc.) in either a fixed or removable fashion, as described in further detail below, whereby PCB module 1300 is operatively (indirectly) connected to the front housing portion 402 via the heatsink 1200. The PCB module 1300 (e.g., the PCB assemblies 1302, 1308) supports various electrical and/or thermal components of the image capture device 400, including at least one (one or more) higher-power (e.g., heat-generating, first) components 1324 (e.g., an SOC 1326 for the image capture device 400, one or more (at least one) power management integrated circuits (PMICs) 1328, and the image sensor 312 (FIG. 10), which is included on the ISLA 1000) and at least one (one or more) lower-power (second) components 1330, which are distributed across the PCB assemblies 1302, 1308, the ISLA 1000, etc. More specifically, in the particular embodiment illustrated, the higher-power components 1324 include (first and second) PMICs 1328$i$, 1328$ii$ (FIGS. 9, 17) and the lower-power components 1330 include an integrated circuit (IC) 1332 (FIGS. 20, 22, 23) (e.g., a WiFi IC, an embedded multi-media card, etc.) and an SD card reader (socket) 1333. It should be appreciated, however, that the particular number and/or functionality of the PMICs 1328 and/or the ICs 1332 may be varied in alternate embodiments without departing from the scope of the present disclosure (e.g., depending upon the particular capabilities of the image capture device 400). Additionally, it should be appreciated that partitioning (distribution) of the various electrical and/or thermal components throughout the image capture device 400 may be dependent upon a variety of factors, including, for example, the area available on different sections of the PCB assemblies 1302, 1308.

The front and rear PCB assemblies 1302, 1308 include rigid bodies 1334, 1336 (FIGS. 22, 23), respectively, which support the higher-power components 1324 and the lower-power components 1330. The bodies 1334, 1336 include a laminated construction that is defined by layers (panels) 1338 of material that are arranged in adjacent relation. The layers 1338 may include (e.g., may be formed from) any suitable material or combination of materials such as, for example, one or more of a (glass-reinforced) epoxy sheet, PTFE, one or more metallic materials, etc., thereby attributing the requisite rigidity to the respective bodies 1334, 1336 of the front and rear PCB assemblies 1302, 1308. While the bodies 1334, 1336 are each illustrated as including a pair of layers 1338 (e.g., an inner layer 1338$i$ and an outer layer 1338$o$) in the particular embodiment illustrated, it should be appreciated that the particular number of layers 1338 may be altered in various embodiments without departing from the scope of the present disclosure (e.g., to increase or decrease the rigidity of the bodies 1334, 1336). As such, embodiments of the bodies 1334, 1336 including both greater and fewer numbers of layers 1338 are also contemplated herein and would not be beyond the scope of the present disclosure.

In contrast to the rigid construction of the PCB assemblies 1302, 1308, the connector 1314 includes a flexible (pliable, elastic), non-rigid construction, which facilitates reconfiguration of the PCB module 1300 between the first configuration (FIG. 22) and the second configuration (FIG. 23). As such, throughout the present disclosure, the connector 1314 may also be referred to as the "flexible connector." It is envisioned that the connector 1314 may include (e.g., may be formed from) any material or combination of materials suitable for the intended purpose of facilitating deformation (bending) in the manner described herein, including, for example, one or more polyimide or polyester films.

As seen in FIG. 22, when the PCB module 1300 is in the first configuration, the PCB assemblies 1302, 1308 are oriented in non-parallel relation. By contrast, when the PCB module 1300 is in the second configuration, the PCB assemblies 1302, 1308 are oriented in generally parallel relation, as seen in FIG. 23. More specifically, in the first configuration, the PCB module 1300 includes a generally L-shaped configuration in which the PCB assemblies 1302, 1308 subtend an angle $\alpha$ (FIG. 22) therebetween that lies substantially within the range of (approximately) 75 degrees to (approximately) 105 degrees (e.g., (approximately) 90 degrees), whereby the body portion 1320 of the connector 1314 and the rear PCB assembly 1308 are oriented in generally parallel relation and the front PCB assembly 1302 extends in generally orthogonal relation to both the body portion 1320 of the connector 1314 and the rear PCB assembly 1308. In the second configuration, the PCB module 1300 includes a generally U-shaped configuration in which the angle $\alpha$ subtended therebetween lies substantially within the range of (approximately) 165 degrees to (approximately) 195 degrees (e.g., (approximately) 180 degrees), whereby the body portion 1320 of the connector 1314 is oriented in generally orthogonal relation to each of the PCB assemblies 1302, 1308 such that the PCB assemblies 1302, 1308 collectively define a (generally U-shaped) chamber 1340 that is configured to receive the chassis 1400, as described in further detail below.

The generally U-shaped configuration of the PCB module 1300 realized upon assembly of the image capture device 400 offers several advantages. For example, the generally U-shaped configuration allows the various electrical and/or thermal components of the image capture device 400 to be included on a single PCB module 1300, which allows for a more compact internal design and further contributes to reductions in the overall form factor of the image capture device 400. Additionally, the generally U-shaped configuration facilitates and simplifies assembly by improving visibility (e.g., via improved access to the component(s) housed (accommodated) within the chamber 1340) and reducing (if not entirely eliminating) blind steps.

As seen in FIGS. 22 and 23, for example, the opposing end portions 1316, 1318 of the connector 1314 are respectively connected to the PCB assemblies 1302, 1308, which facilitates reconfiguration of the PCB module 1300 between the first and second configurations. In the particular embodiment illustrated, the opposing end portions 1316, 1318 extend into, and are positioned within, the rigid bodies 1334, 1336, respectively. More specifically, the layers 1338$i$, 1338$o$ of the rigid body 1334 are positioned about the end portion 1316, and the layers 1338$i$, 1338$o$ of the rigid body 1336 are positioned about the end portion 1318, whereby the end portions 1316, 1318 are sandwiched between the layers 1338 of the rigid bodies 1334, 1336, respectively. It should be appreciated, however, that the PCB assemblies 1302, 1308 and the connector 1314 may be secured together in any suitable manner including, for example, via one or more mechanical fasteners (e.g., screws, pins, rivets, etc.), via an adhesive, via ultrasonic welding, etc.

Depending upon the particular electrical and thermal requirements of the image capture device 400, it is envisioned that the various electrical and/or thermal components thereof may be arranged in a variety of orientations. For example, in the particular embodiment illustrated, the higher-power component(s) 1324 are located on (secured to) the rear PCB assembly 1308, which allows the higher-power component(s) 1324 to interface with the rear housing portion 406 (FIG. 7) and, thus, the heatsink 444, whereas the lower-power component(s) 1330 are located on (secured to) the front PCB assembly 1302. In such embodiments, in order to support the conduction of heat away from the PCB module 1300, it is envisioned that the rear PCB assembly 1308 may be thermally connected to the rear housing portion 406 (e.g., the heatsink 444) via one or more suitable thermal connectors 1342 (FIG. 12) (e.g., graphite sheets 1344 or other such thermally-conductive members) so as to facilitate the transfer of thermal energy from the rear PCB assembly 1308 to the heatsink 444.

In another embodiment of the disclosure, however, it is envisioned that the higher-power component(s) 1324 may be located externally of the chamber 1340 and that the lower-power component(s) 1330 may be located within the chamber 1340. More specifically, the higher-power component(s) 1324 may be secured to the front face 1304 of the front PCB assembly 1302 and the rear face 1312 of the rear PCB assembly 1308, which allows for a thermal interface between the higher-power component(s) 1324 and the heatsinks 444, 1200, and the lower-power component(s) 1330 may be secured to the rear face 1306 of the front PCB assembly 1302 and the front face 1310 of the rear PCB assembly 1308. In such embodiments, in order to support the conduction of heat away from the PCB module 1300, it is envisioned that the PCB assemblies 1302, 1308 may be thermally connected to the heatsinks 444, 1200 via one or more of the aforementioned thermal connectors 1342.

With reference to FIGS. 17-21 in particular, the chassis 1400 will be discussed. The chassis 1400 is configured for positioning (reception) within the chamber 1340 defined by the PCB module 1300 (in the second configuration), whereby, upon assembly of the image capture device 400, the chassis 1400 is positioned between the PCB assemblies 1302, 1308. The chassis 1400 includes a (metallic) frame 1402 (FIGS. 19, 20) that provides a bridge between the PCB assemblies 1302, 1308 and structurally supports the PCB module 1300 within the front housing portion 402 of the image capture device 400. The architecture and configuration of the chassis 1400 allows the PCB module 1300 to be structurally supported solely by the front housing portion 402, which eliminates any need for structural connections between the PCB module 1300 and the rear housing portion 406.

As seen in FIGS. 18 and 19, the PCB module 1300 is mechanically connected to both the heatsink 1200 and the chassis 1400 via the aforementioned mechanical fasteners 1322, which include: one or more mechanical fasteners 1322a; one or more mechanical fasteners 1322b; one or more mechanical fasteners 1322c; and one or more mechanical fasteners 1322d. More specifically, the mechanical fastener(s) 1322a extend through the rear PCB assembly 1308 and into the heatsink 1200, the mechanical fastener(s) 1322b extend through the rear PCB assembly 1308 and into the chassis 1400, the mechanical fastener(s) 1322c extend through the front PCB assembly 1302 and into the heatsink 1200, and the mechanical fastener(s) 1322d extend through the PCB assemblies 1302, 1308, through the chassis 1400, and into the heatsink 1200.

In certain embodiments of the disclosure, it is envisioned that the chassis 1400 may include (or otherwise support) one or more electrical connectors 1404. For example, in the particular embodiment illustrated, the chassis 1400 includes a single USB connector 1406. It should be appreciated, however, that the particular number and/or configuration of the electrical connector(s) 1404 may be varied in alternate embodiments without departing from the scope of the present disclosure.

With general reference now to FIGS. 4, 6, 8, 9, 11-14, 17-23, assembly of the image capture device 400 will be discussed. Initially, the mounting member 800 (FIG. 1) is (externally) connected to the front housing portion 402 via the mechanical fasteners 428 (FIG. 11), which are inserted into the mounts 438i (FIG. 6) in the rearward direction which is identified by the arrow 2. More specifically, the base 808 is positioned adjacent to the flange 420 such that the sealing member 900 (FIGS. 11, 12) is positioned and compressed therebetween so as to form a watertight seal between the front housing portion 402 and the mounting member 800. Thereafter, the heatsink 1200 is connected (secured) to the front housing portion 402 via insertion of the mechanical fasteners 440 through the heatsink 1200 and into the mounts 438ii (FIG. 6), and any necessary electrical connections are made (e.g., between the main board, the power source 700, etc.).

With the heatsink 1200 in place, the sealing member 1100 is brought into contact (engagement) with the mounting member 800 by positioning the sealing member 1100 such that the rib 1104 (FIG. 11) is received by the collar 812. Thereafter, the ISLA 1000 is positioned such that the ISLA 1000 extends through the heatsink 1200 (via the opening 1210), through the sealing member 1100, through the front housing portion 402 (via the window 412), through the sealing member 900, and through the mounting member 800. When so positioned, the collar 1006 of the ISLA 1000 is received by the rib 1104 of the sealing member 1100 and the wings 1008 of the ISLA 1000 are received by the windows 1112 defined between the feet 1106 of the sealing member 1100. The ISLA 1000 is then connected to the mounting member 800 via forward insertion of the mechanical fasteners 828 through the apertures 1002 (FIG. 12) in the wings 1008, through the sealing member 1100, and into the apertures 826 in the eyelets 824 on the mounting member 800, thereby compressing the sealing member 1100 between the ISLA 1000 and the mounting member 800 such that the ISLA 1000, the mounting member 800, and the front housing portion 402 are sealed together via the sealing members 900, 1100.

Either prior or subsequent to installation of the ISLA 1000, the tray 600 (FIGS. 13, 14) is installed and connected to the front housing portion 402. More specifically, the front flanges 602 are inserted into the mounts 438iii (FIG. 6) (e.g., the receptacles 450) and the mounts 438v on the front housing portion 402 are inserted into the through-bores 608. Thereafter, the mechanical fastener 614 is inserted through the opening 606 in the tray 600 and into the mount 438iv (FIG. 6) in the front housing portion 402 to thereby secure the tray 600 in relation to the front housing portion 402. The power source 700 can then be installed and positioned as illustrated in FIG. 9 such that the power source 700 is supported by the tray 600.

Following connection of the ISLA 1000 to the mounting member 800, the PCB module 1300 (FIGS. 9, 17-23) is installed via direct connection to the heatsink 1200 and, thus, operative (indirect) connection to the front housing portion 402. More specifically, with the PCB module 1300 in the first configuration (FIG. 22), the PCB module 1300 is inserted into the internal compartment 408 (FIG. 6) defined by the front housing portion 402 such that the front PCB assembly 1302 is oriented in generally parallel relation to the heatsink 1200. The front PCB assembly 1302 is then connected to the heatsink 1200 via the mechanical fastener(s) 1322c. Following connection of the front PCB assembly 1302 to the heatsink 1200, the rear PCB assembly 1308 and the chassis 1400 are connected via the mechanical fastener(s) 1322b, and the PCB module 1300 is reconfigured into the second configuration (FIGS. 17-21, 23), during which, the connector 1314 deforms (e.g., bends) in the manner reflected in the transition between FIGS. 22 and 23. With the PCB module 1300 in the second configuration, the chassis 1400 housed within the chamber 1340 between the PCB assemblies 1302, 1308, and the rear PCB assembly 1308 is connected to the heatsink 1200 via the mechanical fastener(s) 1322a and to the chassis 1400 and the front PCB assembly 1302 via the mechanical fastener(s) 1322c.

As indicated above, the various electrical and/or thermal components of the image capture device 400 may be arranged in a variety of orientations (e.g., depending upon the particular electrical and thermal requirements of the image capture device 400). As such, it is envisioned that reconfiguration of the PCB module 1300 into the second configuration may result in positioning of the lower-power component(s) 1330 (FIGS. 20, 22, 23) adjacent to the heatsink 1200 and positioning of the higher-power component(s) 1324 adjacent to the heatsink 444. Alternatively, it is envisioned that reconfiguration of the PCB module 1300 into the second configuration may result in positioning of the higher-power component(s) 1324 such that they are located externally of the chamber 1340 and directed outwardly (e.g., towards the heatsinks 444, 1200) and positioning of the lower-power component(s) 1330 within the chamber 1340 such that they are directed inwardly (e.g., away from the heatsinks 444, 1200).

Following installation of the PCB module 1300, the PCB module 1300 is thermally and/or electrically connected to heatsink 1200 and/or the heatsink 444 (FIG. 7) on the rear housing portion 406. More specifically, depending upon the particular configuration of the image capture device 400 and the PCB module 1300, it is envisioned that the higher-power component(s) 1324 (e.g., the camera SOC 1326 and the PMIC(s) 1328) may be thermally connected to the heatsink 444 (e.g., exclusively) or, alternatively, that the higher-power component(s) 1324 may be thermally connected to the heatsink 444 and the heatsink 1200 so as to divide the thermal load generated during operation of the image capture device 400 between the heatsinks 444, 1200.

Thereafter, the adhesive 448 (FIG. 8) is applied to the recess 446 defined by the rear housing portion 406 and/or the tongue 432 extending from the front housing portion 402. Before the adhesive 448 dries (cures), the respective front and rear housing portions 402, 406 are connected via insertion of the tongue 432 into the recess 446, during which, the tabs 454 on the rear housing portion 406 engage (contact) the rear flanges 604 on the tray 600. The adhesive 448 is then allowed to dry (cure) to connect (secure) together the housing portions 402, 406 and form a seal therebetween, establishing a watertight internal environment for the components of the image capture device 400. The interconnect mechanism 136 (FIGS. 1B, 4, 9) is then connected to the front housing portion 402 via insertion of the mechanical fasteners 442 (FIG. 6) through the interconnect mechanism 136 and into the mounts 438v, and the cover 500 is connected to the mounting member 800 via the ears 818 (FIG. 1) on the collar 810.

While the present disclosure has been described in connection with certain embodiments, it is to be understood that the present disclosure is not to be limited to the disclosed embodiments, but, on the contrary, is intended to cover various modifications and equivalent arrangements included within the scope of the appended claims, which scope is to be accorded the broadest interpretation so as to encompass all such modifications and equivalent structures as is permitted under the law.

Persons skilled in the art will understand that the various embodiments of the present disclosure and shown in the accompanying figures constitute non-limiting examples, and that additional components and features may be added to any of the embodiments discussed hereinabove without departing from the scope of the present disclosure. Additionally, persons skilled in the art will understand that the elements and features shown or described in connection with one embodiment may be combined with those of another embodiment without departing from the scope of the present disclosure to achieve any desired result and will appreciate further features and advantages of the presently disclosed subject matter based on the description provided. Variations, combinations, and/or modifications to any of the embodiments and/or features of the embodiments described herein that are within the abilities of a person having ordinary skill in the art are also within the scope of the present disclosure, as are alternative embodiments that may result from combining, integrating, and/or omitting features from any of the disclosed embodiments.

Use of the term "optionally" with respect to any element of a claim means that the element may be included or omitted, with both alternatives being within the scope of the claim. Additionally, use of broader terms such as "comprises," "includes," and "having" should be understood to provide support for narrower terms such as "consisting of," "consisting essentially of," and "comprised substantially of." Accordingly, the scope of protection is not limited by the description set out above, but is defined by the claims that follow, and includes all equivalents of the subject matter of the claims.

In the preceding description, reference may be made to the spatial relationship between the various structures illustrated in the accompanying drawings, and to the spatial orientation of the structures. However, as will be recognized by those skilled in the art after a complete reading of this disclosure, the structures described herein may be positioned and oriented in any manner suitable for their intended purpose. Thus, the use of terms such as "above," "below," "upper," "lower," "inner," "outer," "left," "right," "upward," "downward," "inward," "outward," "horizontal," "vertical," etc., should be understood to describe a relative relationship between the structures and/or a spatial orientation of the structures. Those skilled in the art will also recognize that the use of such terms may be provided in the context of the illustrations provided by the corresponding figure(s).

Additionally, terms such as "generally," "approximately," "substantially," and the like should be understood to include the numerical range, concept, or base term with which they are associated as well as variations in the numerical range, concept, or base term on the order of 25% (e.g., to allow for manufacturing tolerances and/or deviations in design). For example, the term "generally parallel" should be understood as referring to an arrangement in which the pertinent components (structures, elements) subtend an angle therebetween that is equal to 180° as well as an arrangement in which the pertinent components (structures, elements) subtend an angle therebetween that is greater than or less than 180° (e.g., ±25%). The term "generally parallel" should thus be understood as encompassing configurations in which the pertinent components are arranged in parallel relation.

Although terms such as "first," "second," "third," etc., may be used herein to describe various operations, elements, components, regions, and/or sections, these operations, elements, components, regions, and/or sections should not be limited by the use of these terms in that these terms are used to distinguish one operation, element, component, region, or section from another. Thus, unless expressly stated otherwise, a first operation, element, component, region, or section could be termed a second operation, element, component, region, or section without departing from the scope of the present disclosure.

Each and every claim is incorporated as further disclosure into the specification and represents embodiments of the present disclosure. Also, the phrases "at least one of A, B, and C" and "A and/or B and/or C" should each be interpreted to include only A, only B, only C, or any combination of A, B, and C.

What is claimed is:

1. An image capture device comprising:
   a front housing portion defining an internal compartment;
   a rear housing portion connected to the front housing portion so as to form a watertight seal therebetween;
   a tray positioned between the front housing portion and the rear housing portion;
   a power source supported by the tray;
   a heatsink connected to the front housing portion and configured to distribute thermal energy through the image capture device;
   an integrated sensor-lens assembly (ISLA) extending through the heatsink, the ISLA including:
      an image sensor; and
      a lens positioned to receive and direct light onto the image sensor;
   a mounting member connected to the front housing portion and to the ISLA such that the ISLA is indirectly connected to the front housing portion via the mounting member;
   a printed circuit board (PCB) module connected to the heatsink, the PCB module including:
      a front PCB assembly and a rear PCB assembly each supporting one or more electrical and/or thermal components of the image capture device; and
      a flexible connector extending between the front PCB assembly and the rear PCB assembly, the flexible connector facilitating reconfiguration of the PCB module during assembly of the image capture device between a first configuration, in which the front PCB assembly and the rear PCB assembly are oriented in non-parallel relation, and a second configuration, in which the front PCB assembly and the rear PCB assembly are oriented in generally parallel relation; and
   a chassis positioned between the front PCB assembly and the rear PCB assembly, the chassis including a frame structurally supporting the PCB module.

2. The image capture device of claim 1, wherein the front housing portion defines a window configured to receive the mounting member such that the mounting member extends through the window and into the internal compartment.

3. The image capture device of claim 2, wherein the mounting member includes a front end portion extending externally of the image capture device and a rear end portion extending into the image capture device, the ISLA connected to the rear end portion of the mounting member.

4. The image capture device of claim 3, wherein the front end portion of the mounting member is configured for releasable connection to a cover for the image capture device such that the cover is repeatedly connectable to and disconnectable from the image capture device via the mounting member.

5. The image capture device of claim 1, wherein the tray defines through-bores configured to receive mounts extending inwardly from the front housing portion, the mounts configured to receive fasteners that connect the front housing portion to an interconnect mechanism configured for engagement with an accessory such that the image capture device is connectable to the accessory via the interconnect mechanism.

6. The image capture device of claim 5, wherein the tray includes:
   a front flange engaging the front housing portion; and
   a rear flange engaging the rear housing portion.

7. The image capture device of claim 1, wherein the PCB module is generally L-shaped in the first configuration and generally U-shaped in the second configuration, the PCB module defining a generally U-shaped chamber in the second configuration that is configured to receive the chassis such that the chassis is positioned between the front PCB assembly and the rear PCB assembly.

8. The image capture device of claim 1, wherein the front PCB assembly and the rear PCB assembly each include a rigid body with a laminated construction defined by layers arranged in adjacent relation.

9. The image capture device of claim 8, wherein the flexible connector includes a first end portion and a second end portion, the first end portion positioned within the rigid body of the front PCB assembly between the layers thereof and the second end portion positioned within the rigid body of the rear PCB assembly between the layers thereof.

10. The image capture device of claim 1, wherein the chassis includes at least one electrical connector.

11. A method of assembling an image capture device, the method comprising:
   connecting a first heatsink to a front housing portion of the image capture device, wherein the first heatsink includes an enclosed opening extending therethrough;
   inserting an integrated sensor-lens assembly (ISLA) through the enclosed opening in the first heatsink, wherein the ISLA includes:
      an image sensor; and
      a lens positioned to receive and direct light onto the image sensor;
   inserting a printed circuit board (PCB) module including a front PCB assembly and a rear PCB assembly into the front housing portion with the PCB module in a first configuration in which the front PCB assembly and the rear PCB assembly are oriented in non-parallel relation;
   reconfiguring the PCB module from the first configuration into a second configuration in which the front PCB assembly and the rear PCB assembly are oriented in generally parallel relation;
   connecting the PCB module to the first heatsink; and
   thermally connecting the PCB module to a rear housing portion including a second heatsink, wherein the first heatsink and the second heatsink are formed as discrete components of the image capture device,
   wherein reconfiguring the PCB module from the first configuration into the second configuration includes orienting at least one first component on the PCB module such that the at least one first component is directed outwardly towards the first heatsink and the second heatsink and orienting at least one second component on the PCB module such that the at least one second component is directed inwardly away from the first heatsink and the second heatsink, the at least one first component including a system-on-chip and at least one power management integrated circuit, and the at least one second component including at least one integrated circuit.

12. The method of claim 11, wherein thermally connecting the PCB module to the rear housing portion includes thermally connecting the second heatsink to a system-on-chip and at least one power management integrated circuit.

13. The method of claim 11, further comprising thermally connecting the at least one first component to the first heatsink and the second heatsink.

* * * * *